United States Patent [19]

Carey

[11] Patent Number: 5,091,339
[45] Date of Patent: Feb. 25, 1992

[54] TRENCHING TECHNIQUES FOR FORMING VIAS AND CHANNELS IN MULTILAYER ELECTRICAL INTERCONNECTS

[75] Inventor: David H. Carey, Austin, Tex.

[73] Assignee: Microelectronics and Computer Technology Corporation, Austin, Tex.

[21] Appl. No.: 557,427

[22] Filed: Jul. 23, 1990

[51] Int. Cl.$^5$ .................. H01L 21/283; H01L 21/306
[52] U.S. Cl. .................................. 437/187; 437/203; 437/225; 437/228; 437/229
[58] Field of Search ............... 437/203, 187, 229, 228, 437/225

[56] References Cited

U.S. PATENT DOCUMENTS

| | | | |
|---|---|---|---|
| 4,417,393 | 11/1983 | Becker | 29/846 |
| 4,584,761 | 4/1986 | Wu | 29/571 |
| 4,651,417 | 3/1987 | Schumacher, III et al. | 29/848 |
| 4,701,351 | 10/1987 | Jackson | 427/98 |
| 4,702,792 | 10/1987 | Chow et al. | 156/628 |
| 4,810,332 | 3/1989 | Pan | 204/15 |
| 4,962,058 | 10/1990 | Cromin et al. | 437/228 |

FOREIGN PATENT DOCUMENTS

| | | | |
|---|---|---|---|
| 0224013 | 6/1987 | European Pat. Off. | 437/203 |
| 0055546 | 4/1980 | Japan | 437/187 |
| 0076143 | 4/1985 | Japan | 437/187 |
| 0152040 | 7/1986 | Japan | 437/203 |
| 0187236 | 8/1986 | Japan | 437/203 |
| 0155537 | 7/1987 | Japan | 437/203 |
| 0006847 | 1/1988 | Japan | 437/203 |
| 0191443 | 8/1989 | Japan | 437/203 |

OTHER PUBLICATIONS

Contolini et al., "Embedded Conductors by Electrochemical Planarization", Abstract No. 184, Abstracts from the Spring Electrochemical Society Meeting, Los Angeles, Calif., May 7, 1989.

Pai et al., "A Planarization Metallization Process Using Selective Electroless Deposition and Spin-On Glass", Abstract No. 481, Fall Meeting, Electrochemical Society, Honolulu, Hi., Oct. 23, 1987, p. 678.

Mutter, "Choice Stop Material for Chemical/Mechanical Polish Planarization", IBM Technical Disclosure Bulletin, vol. 27, No. 8, Jan. 1985.

Koburger, "Trench Planarization Technique", IBM Technical Disclosure Bulletin, vol. 27, No. 6, p. 3242, Nov. 1984.

Rothman et al., "Lift-Off Process to Form Planar Metal/Sputtered SiO2 Structures", Jun. 25–26, 1985, V-MIC Conference, pp. 131–137, Jun. 1985.

Beyer et al., "Glass Planarization by Stop-Layer Polishing", IBM Technical Disclosure Bulletin, vol. 27, No. 8, pp. 4700–4701, Jan. 1985.

Bennett et al., "Selective Planarization Process and Structures", IBM Technical Disclosure Bulletin, vol. 27, No. 4B, pp. 2560–2563, Sep. 1984.

(List continue on next page.)

Primary Examiner—Olik Chaudhuri
Assistant Examiner—Ourmazo S. Ojan
Attorney, Agent, or Firm—David M. Sigmond

[57] ABSTRACT

Channels extending partially through and vias extending completely through an insulating layer in an electrical interconnect such as a substrate or integrated circuit can be formed in a relatively few steps with low cost etching and patterning techniques. The channels and vias can then be filled with an electrical conductor in a relatively few steps. In one embodiment a non-erodible hard mask exposing the vias and channels is placed over a polyimide layer, an erodible soft mask exposing the vias but covering the channels is placed over the hard mask, and a plasma etch is applied. The via regions are etched until the soft mask completely erodes and then both the via and channel regions are etched to provide partially etched channels and fully etched vias. Thereafter a seed layer is deposited over the interconnect, and an electrically conductive layer is electrolytically deposited over the seed layer substantially filling the channels and vias. The interconnect surface is then planarized by polishing until the electrical conductor remains only in the channels and vias.

49 Claims, 22 Drawing Sheets

OTHER PUBLICATIONS

Author unknown, "Chemical Vapor Deposited Device Isolation with Chemical/Mechanical Planarization", IBM Technical Disclosure Bulletin, vol. 29, No. 2, pp. 577–579, Jul. 1986.

Chakravorty et al., "Photosensitive Polyimide as a Dielectric in High Density Thin Film Copper–Polyimide Interconnect Structures", The Electrochemical Society Extended Abstracts, vol. 88-1, Abstract No. 54, pp. 77–78, May, 1988.

Ting, "Electroless Deposition for Integrated Circuit Fabrication", Abstract No. 512, Fall Meeting, Electrochemical Society, Honolulu, Hi., Oct. 23, 1987, p. 720.

Wu, "PRAIRE—A New Planarization Technique and It's Applications in VLSI Multilevel Interconnection", Proceedings of the Symposium on Multilevel Interconnection, and Contact Technologies: Electrochemical Society, vol. 87-4, pp. 239–249, 1987.

Riley et al., "Planarization of Dielectric Layers for Multilevel Metallization", IEEE Transactions on Semiconductor Manufacturing, vol. 1, No. 4, Nov. 1988.

Iwasaki et al., "A Pillar–Shaped Via Structure in a Cu–Polyimide Multilayer Substrate", IEEE/CHMT '89 Japan IEMT Symposium, pp. 128–131, 1989.

Broadbent et al., "High–Density High–Reliability Tungsten Interconnection by Filled Interconnect Groove Metallization", IEEE Transactions on Electron Devices, vol. 35, No. 7, pp. 952–956, Jul. 1988.

"Lithographic Patterns with a Barrier Liner", IBM Technical Disclosure Bulletin, vol. 32, No. 10B, Mar. 1990, pp. 114–115.

TRENCHING TECHNIQUES FOR FORMING VIAS AND CHANNELS IN MULTILAYER ELECTRICAL INTERCONNECTS

BACKGROUND

The present invention is directed to trenching techniques for conductive electronic interconnects, and more particularly to methods for fabricating channels and vias in high density multilayers such as substrates and integrated circuits in few and simple steps.

High density copper/polyimide interconnects can be fabricated by providing conductors on a base, building interlayer pillars on the conductors, and coating the conductor-pillar structure with polyimide. This has several drawbacks: the metal conductor-pillar structure is vulnerable to mechanical damage before polyimide encapsulation; resist scumming can develop on underlying patterned layers after wet chemical etching; particles on the surface prior to plating can plate up quickly causing interlayer short circuits; and cooling after the 400° C. polyimide cure can create stress between the copper and polyimide since copper has a greater thermal coefficient of expansion.

These drawbacks associated with conductor-pillar structures can be overcome by forming trenches for vias and channels in a polyimide layer and then filling the trenches with a conductor. One such method for fabricating high density electronic circuits having narrow conductors is disclosed by Becker in U.S. Pat. No. 4,417,393. There are several drawbacks to Becker's method, including the need for two insulating layers with different depths to form vias and conductors in an insulating layer, the need for laser machining, and the inability to incorporate electrodeposition.

Furthermore, current interconnect fabrication methods with relatively few steps form conductive channels and vias simultaneously but fail to provide via stacking. Alternative methods which provide via stacking require a relatively large number of process steps.

SUMMARY OF THE INVENTION

The present invention provides trenching techniques for fabrication of electrical interconnects by forming the conductor channels and vias using well known low cost processes such as die stamping, etching, plating and polishing in relatively few steps while retaining design flexibility. Multilevel electrical interconnects suitable for the present invention include substrates, printed circuit boards, printed wiring boards, thin film interconnects, planar integrated circuit interconnects, multilevel integrated circuit wiring and the like.

An object of the present invention is to form vias and channels in an insulating layer with relatively few and simple process steps, as well as filling the vias and channels with a conductor with relatively few and simple process steps.

Still another object of the present invention is to form conductive channels and vias simultaneously as well as to provide via stacking.

Another object of the present invention is to minimize yield loss mechanisms that often accompany multilayer interconnect assembly, such as pinholes and mechanical weakness.

In accomplishing the foregoing objects, there is provided in accordance with one aspect of the present invention a method for fabricating an electrically conductive interconnect, comprising the sequential steps of providing an insulating layer on a base, forming a channel in the top surface and partially through the thickness of the insulating layer, forming a via in the top surface and completely through the thickness of the insulating layer adjacent the channel, depositing an electrical conductor into the channel and via, and planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

Further objects, features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1A:
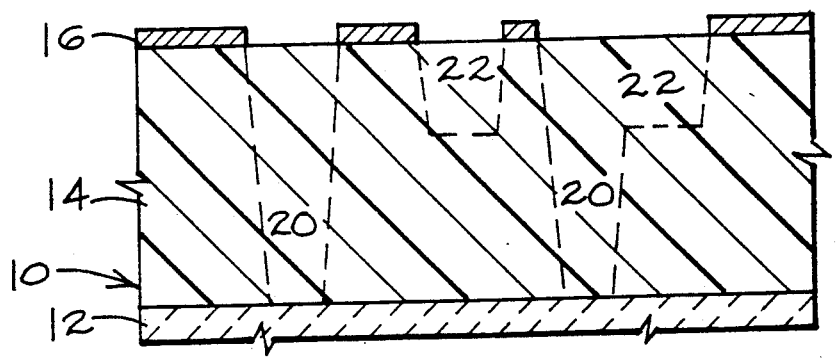
FIGS. 1a-1f are cross-sectional views detailing a method of forming the vias and channels with a hard mask and soft mask in accordance with a first embodiment of the invention.

Eight embodiments for forming conductor channels and vias in multilayer electrical interconnects are now described. For illustration purposes, a multilayer electrical interconnect will be depicted by a copper/polyimide substrate 10 in the examples that follow. In embodiments 1, 2, 3 and 6 the vias and channels are formed in a single step, whereas in embodiments 4, 5, 7 and 8 the vias and channels are formed in separate steps. In embodiments 7 and 8 an irradiation source is required. In embodiment 7 two polyimide layers are required.

FIRST EMBODIMENT

Referring now to the drawings, a high density electronic interconnect substrate designated as 10 is fabricated on a base 12. Base 12 is shown as a ceramic such as alumina ceramic or glass ceramic, however, it is understood that base 12 can be an organic or inorganic insulator, a conductor, an integrated circuit, or a preceding layer if the interconnect is a multilevel structure. Base 12 may require appropriate surface preparation, such as polishing, cleaning, etching, or roughening to assure acceptable contamination removal and/or surface finish. For example it may be advantageous to roughen a copper/polyimide base by plasma etching, or to smoothen a ceramic, plastic, or metal base by polishing. An insulating layer shown as polyimide layer 14 having 15 microns thickness is deposited over and cured on base 12.

Figure 1B:
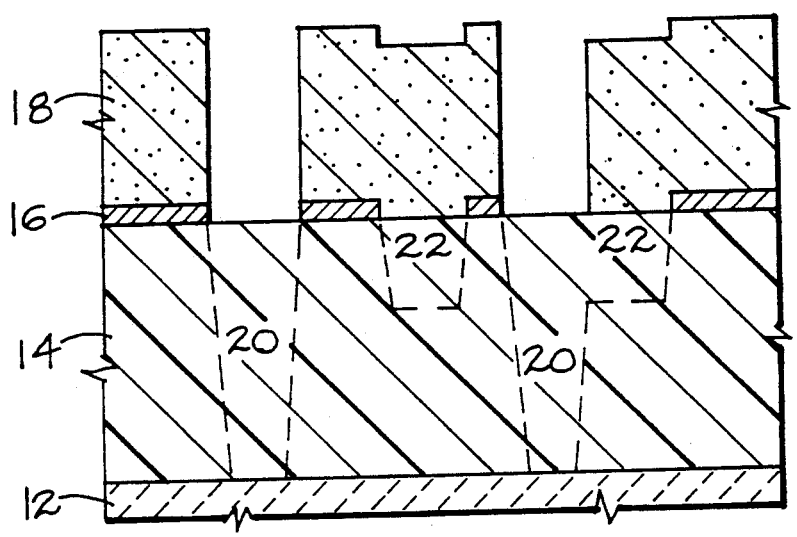
Figure 1C:
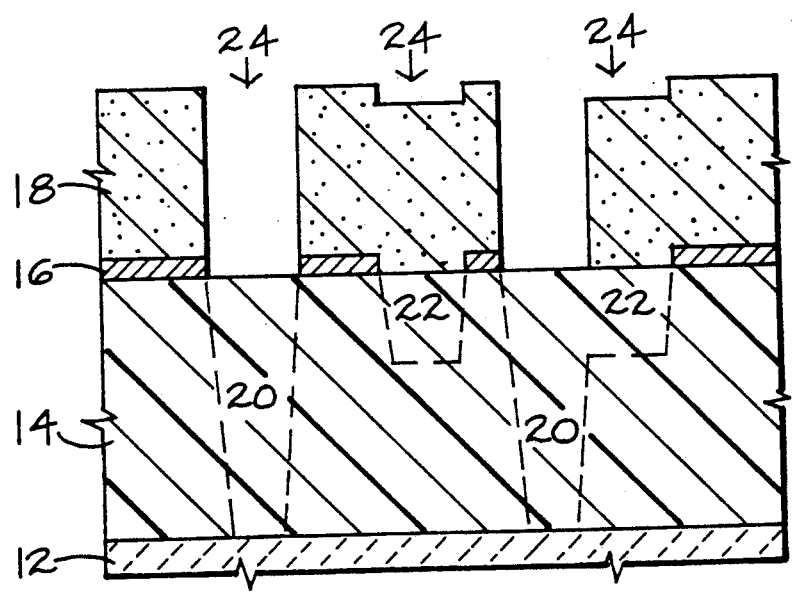
Figure 1D:
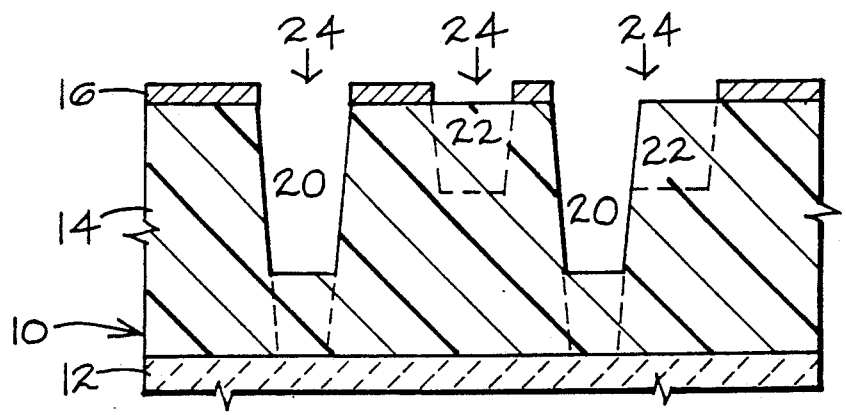
Figure 1E:
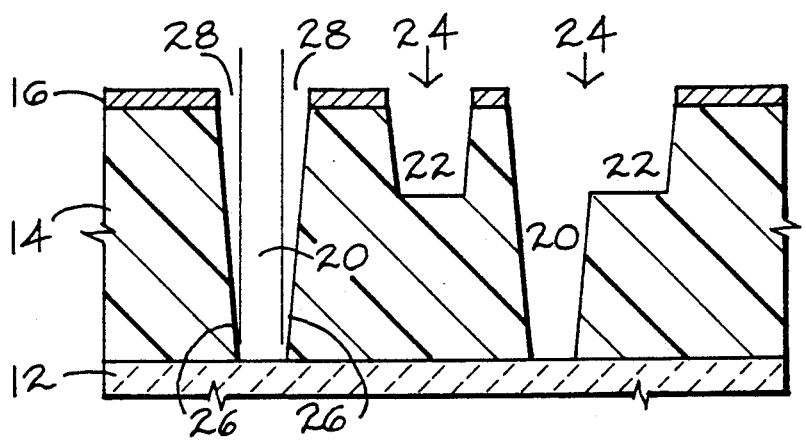
Figure 1F:
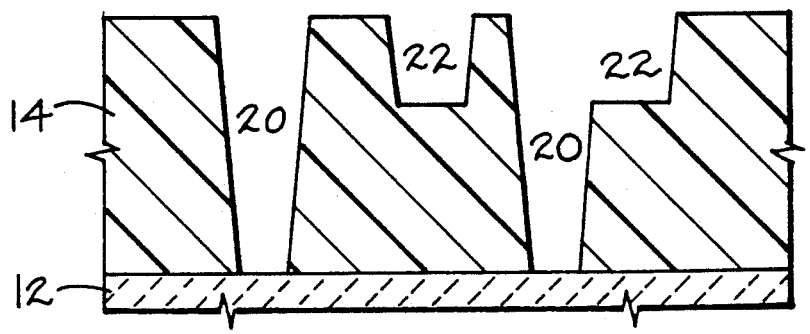
Figure 14A:
FIGS. 14a–14b are photomicrographs of vias and channels formed according to the first embodiment of the present invention.
Figure 14B:

FIGS. 1a–1f show a first embodiment for forming the conductor channels and vias. In FIG. 1a a thin blanket layer of metal such as 2500 angstroms copper over 700 angstroms chromium is sputtered over polyimide layer 14 to form hard mask 16, which after conventional patterning has openings to expose via regions 20 and channel regions 22. In FIG. 1b soft mask 18 of photoresist, which can also be silicon-dioxide or silicon-nitride, is placed over hard mask 16 and after conventional patterning has openings to expose via regions 20 but covers channel regions 22. Thus via regions 20 are exposed but channel regions 22 are not exposed. In FIG. 1c a suitable etch is applied wherein hard mask 16 is non-erodible but soft mask 18 erodes. For illustration purposes a dry etcher can generate plasma etch 24. That is, as plasma etch 24 is applied hard mask 16 etchs slowly or not at all while soft mask 18 etchs rapidly and merely causes a time delay until plasma contacts the regions covered by soft mask 18. Soft mask 18 is made thick enough to provide the correct etching time delay for underlying polyimide layer 14. In this example via regions 20 are intended to be 10 microns deeper than channel regions 22, so soft mask 18 can be 10 microns thick photoresist provided it etches at the same rate as underlying polyimide layer 14. Thus the thickness of soft mask 18 can be adjusted for differential etch rates between soft mask 18 and underlying polyimide 14. Plasma etch 24 can comprise 90% $O_2$ and 10% $SF_6$ at 600 watts RF power and 150 millitorrs pressure, although the parameters for plasma etch 24 such as power, pressure, chemistry, and electrode spacing are highly variable depending on the desired etch rates, profiles, and etcher machines. As via regions 20 begin to etch channel regions 22 remain covered and undisturbed, and soft mask 18 begins to erode. Plasma etch 24 will tend to etch vertically and attack the exposed surfaces at the same rate. FIG. 1d shows soft mask 18 completely eroded, and via regions 20 partially etched through polyimide layer 14. If desired, via regions 20 could be fully etched at this stage. As plasma etch 24 continues, FIG. 1e shows via regions 20 etched 15 microns through the entire thickness of polyimide layer 14, and channel regions 22 etched 5 microns through a partial thickness of polyimide layer 14. The depth of 5 micron channels in a 15 micron insulating layer was selected as a compromise between the Scylla and Charybdis of high line resistance from too thin a channel and low characteristic impedance (i.e. capacitive loading) from too thick a channel. Via sidewalls 26 preferably are tilted at sidewall angle 28 of 20° and converge toward the bottom of polyimide layer 14 to improve fabrication of additional materials thereon. The selection of sidewall angle 28 is a trade-off between denser vias from more vertical sidewall slopes and improved step coverage vias from less vertical sidewall slopes. Sloped via sidewalls may be difficult to accomplish with a hard mask and a dry etch since the plasma may etch anisotropically. In FIG. 1f plasma etch 24 is discontinued and hard mask 16 is removed from polyimide layer 14. Via regions 20 and channel regions 22 are now formed. Substrate 10 may now require surface cleaning if contamination develops from etch products not carried away by the etch process. The formation of vias and channels in a polyimide layer in accordance with the first embodiment was demonstrated as shown in FIGS. 14a and 14b.

While dry etching with a plasma etch is the preferred method of etching, other etching methods are suitable for selectively removing material from the insulating layer. A wet chemical etch can be used, and may be more isotropic then a plasma etch thereby facilitating a slope on the via sidewalls, however a wet etch may lead to a via sidewall slope which is too large and/or a wet etch may not have sufficient accuracy for fine pitch geometries. Another suitable etching method is photoablation, or light based etching. The use of an excimer laser to remove selected regions of materials by photoablation in Order to pattern the underlying layer is well known in the art. This is termed "ablative photodecomposition" (APD) and requires high powered pulsed sources. U.S. Pat. No. 4,414,059 describes an APD process in which ultraviolet radiation of wavelengths less than 220 nm cause fragmentation of resist polymer chains and the immediate escape of the fragmented portions from the resist layer. In effect the incident energy is transferred to kinetic energy in rapid and large amounts of bond breaking whereby the polymer chains are fragmented and explode-off as volatile by-products. This is a "positive" process since after the substrate is flooded with light the exposed regions of the polyimide as well as a soft mask will etch. The use of ultraviolet radiation particularly for APD and etching of polyimide is known in the art. U.S. Pat. No. 4,508,749 by Brannon et al describes the use a of U.V. source between 240–400 nm to etch through a polyimide layer. Brannon et al is primarily directed to producing tapered openings in the polyimide structure between metallization layers so that metallization can then be deposited in the openings to connect metallic layers adjacent to the top and bottom surfaces of the polyimide. Plasma etching is preferred over photoablation since plasma etching is fairly easy to apply over a wide field whereas currently photoablation is not.

SECOND EMBODIMENT

Figure 2A:
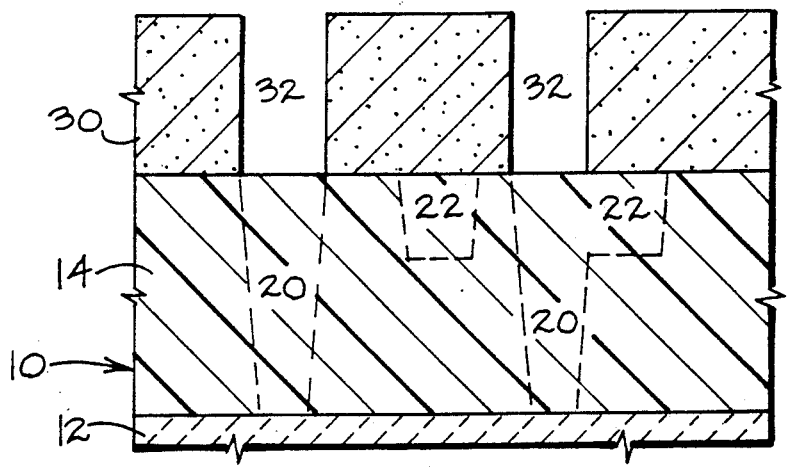
FIGS. 2a-2f are cross-sectional views detailing a method of forming the vias and channels with two stacked soft masks in accordance with a second embodiment of the invention.
Figure 2B:
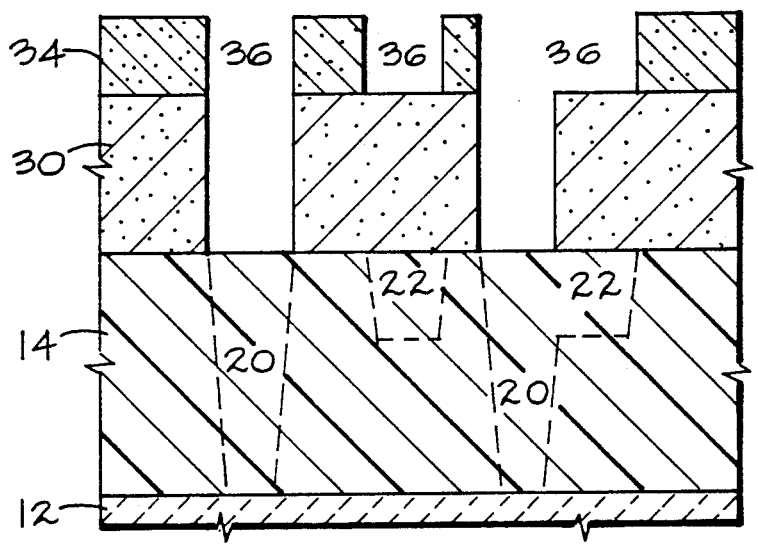
Figure 2C:
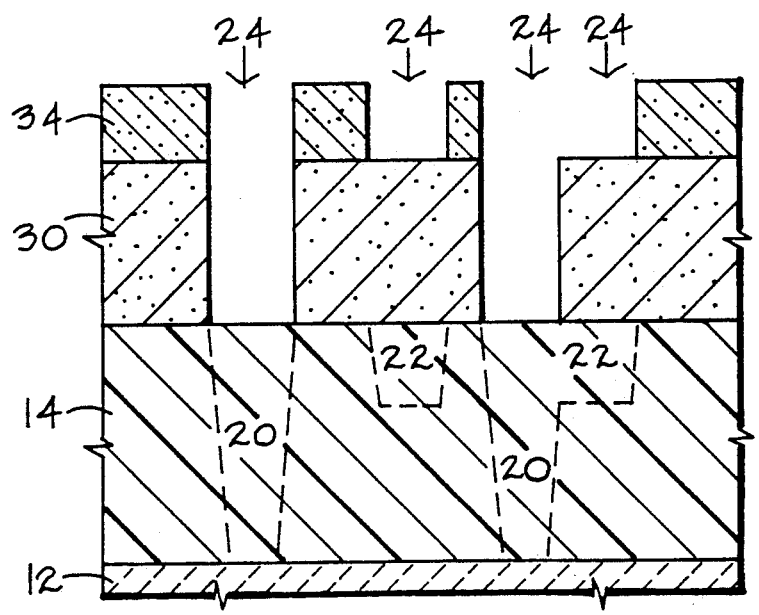
Figure 2D:
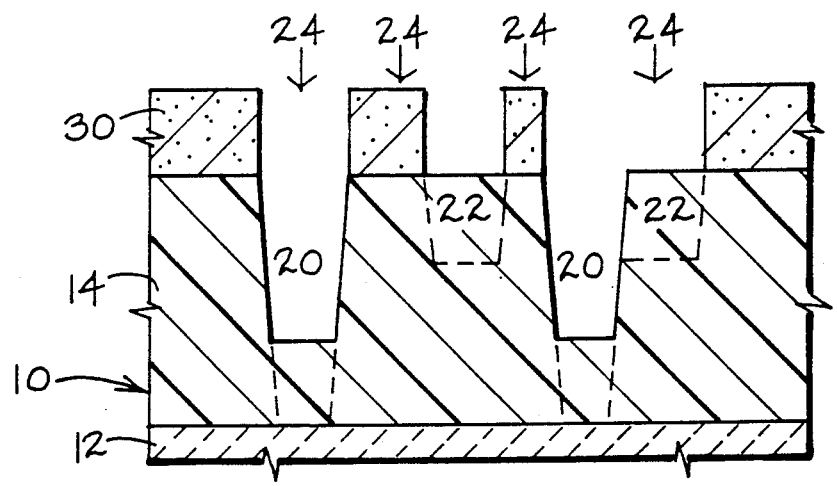
Figure 2E:
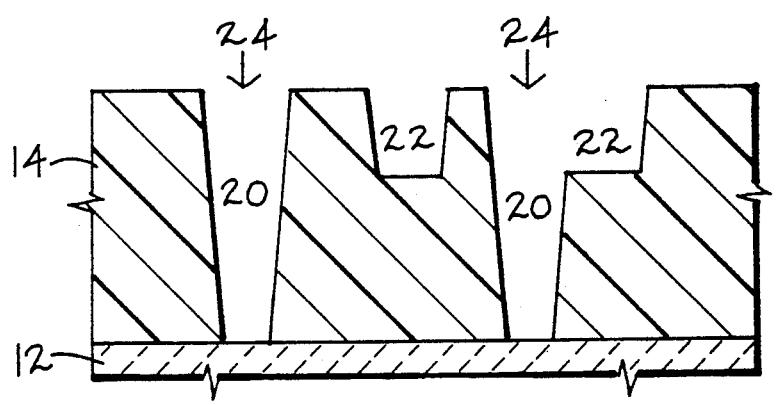
Figure 2F:
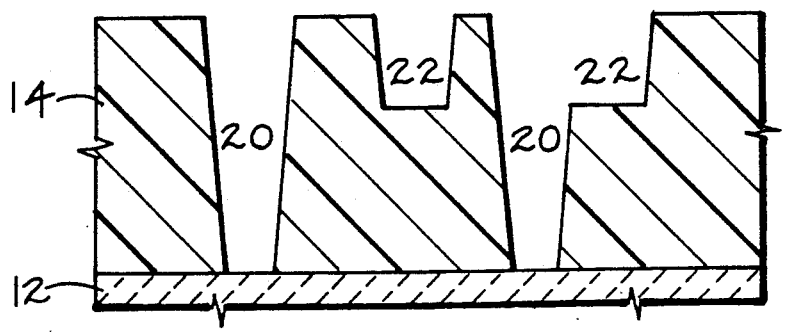
Figure 3A:
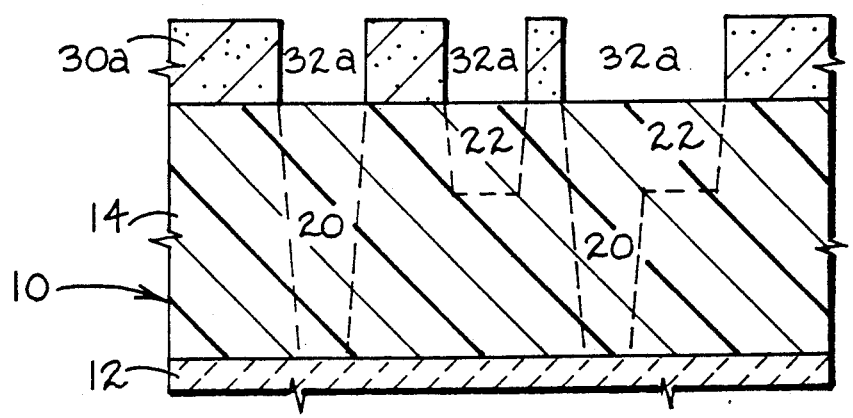
FIGS. 3a-3f are cross-sectional views detailing another method of forming the vias and channels with two stacked soft masks in accordance with a third embodiment of the invention.
Figure 3B:
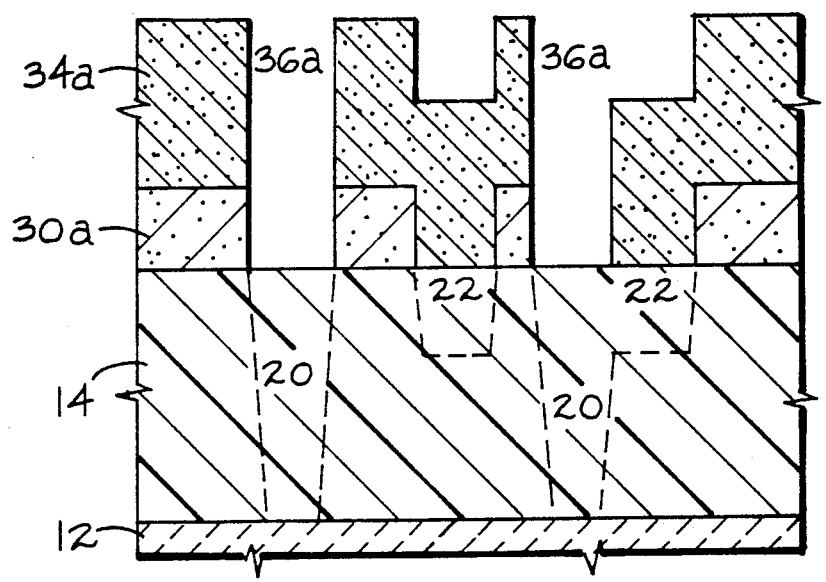
Figure 3C:
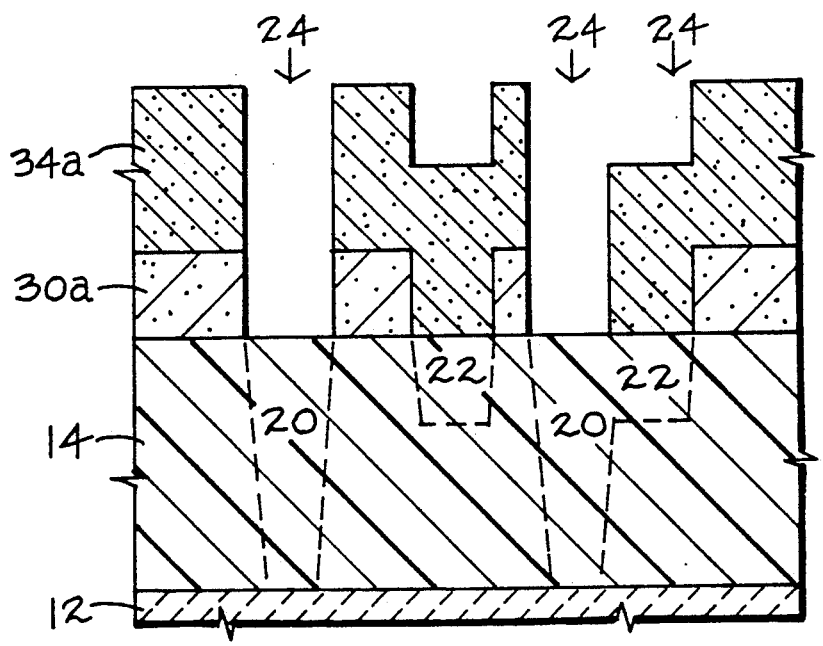
Figure 3D:
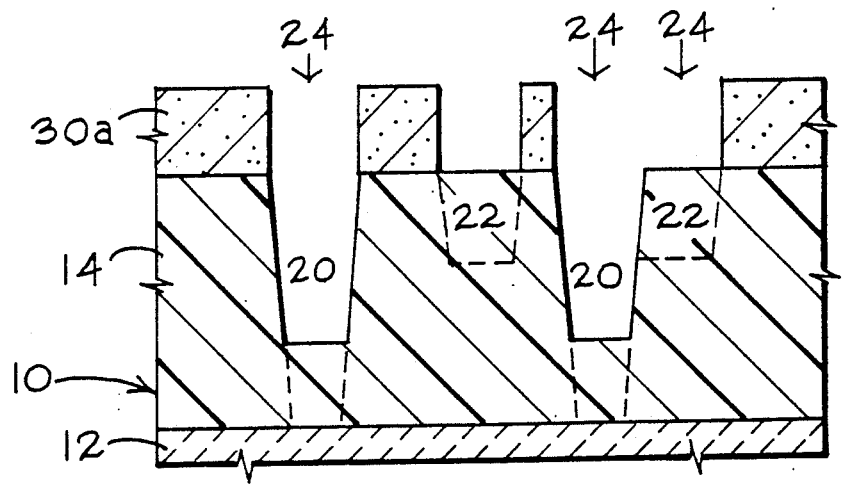
Figure 3E:
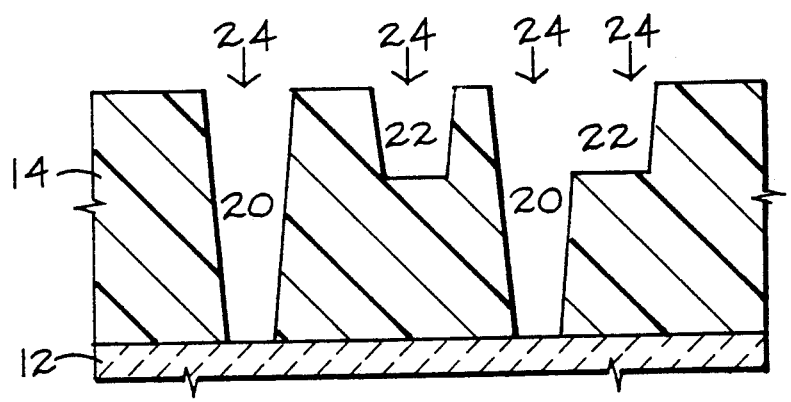
Figure 3F:
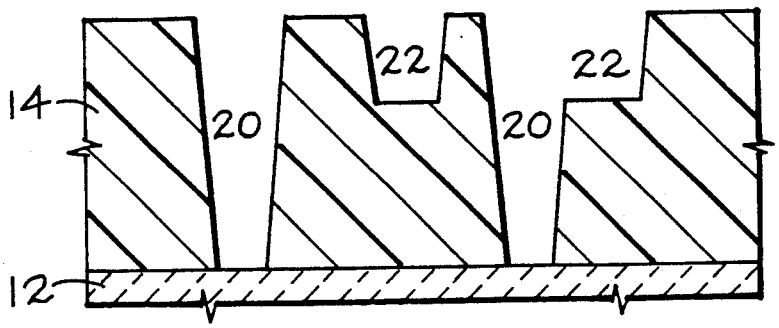

FIGS. 2a-2f show a second embodiment for forming the conductor channels and vias in which any description for the first embodiment in FIGS. 1a-1f is incorporated herein insofar as the same is applicable, and the same description is not repeated. FIG. 2a shows lower soft mask 30 having openings 32 exposing via regions 20 but covering channel regions 22 placed over polyimide layer 14. FIG. 2b shows upper soft mask 34 having openings 36 exposing via regions 20 and channel regions 22 placed over lower soft mask 30. Via openings 32 and 36 are aligned to assure proper placement of via regions 20. FIG. 2c shows plasma etch 24 applied to upper soft mask 34. As plasma etch 24 is applied via regions 20 begin to etch and upper soft mask 34 begins to erode. FIG. 2d shows upper soft mask 34 completely eroded, lower soft mask 30 eroded over channel regions 22, and via regions 20 partially etched through polyimide layer 14. Plasma etch 24 continues, and in FIG. 2e via regions 20 are etched entirely through polyimide layer 14, channel regions 22 are etched partially through polyimide layer 14, and lower soft mask 30 has completely eroded. In FIG. 2f plasma pattern transfer has occurred and etch 24 is discontinued. It is understood that soft masks 30 and 34 are shown as completely eroded for illustration purposes only, since pattern transfer can also be achieved if one or both of soft masks 30, 34 are only partially eroded, in which case the non-eroded portions remaining after via regions 20 and channel regions 22 are formed and plasma etch 24 is discontinued would be removed from substrate 10 such as by stripping. The use of two soft masks instead of the soft mask and hard mask combination described in the first embodiment is a trade-off since two soft masks require fewer process steps but may require greater process control.

THIRD EMBODIMENT

FIGS. 3a-3f show a third embodiment for forming the conductor channels and vias in a single step which is identical to the second embodiment in FIGS. 2a-2f, except the lower and upper soft masks have been switched. Lower soft mask 30a has openings 32a exposing via regions 20 and channel regions 22, while upper soft mask 34a has openings 36a exposing via regions 20a but covers channel regions 22a. The same via and channel etching results.

The first, second, and third embodiments for forming the conductor channels and vias in a single step are further advantageous in that the adverse effect of mask pinholes is minimized. Pinholes commonly form in masks to create unwanted openings. However, the location of pinholes tends to be random and highly scattered and the chances of pinholes lining up in an upper and lower mask are slim.

FOURTH EMBODIMENT

Figure 4A:
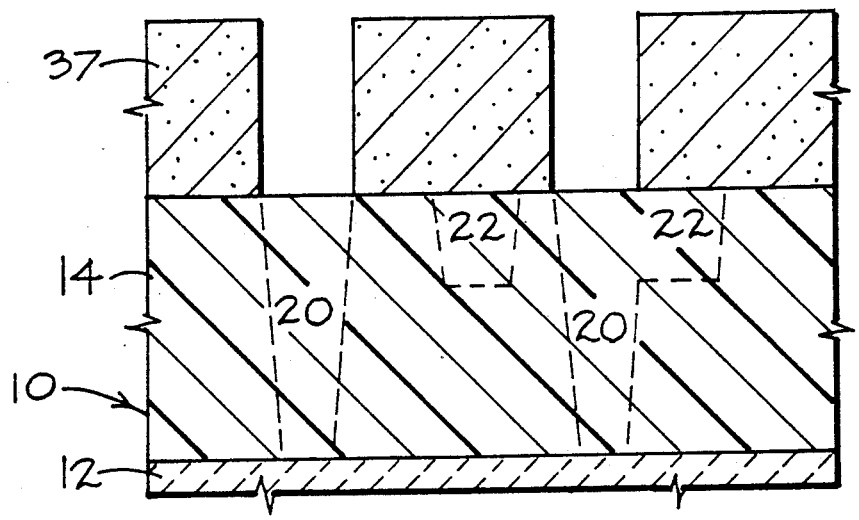
FIGS. 4a-4g are cross-sectional views detailing a method of forming the vias and channels with two soft masks applied and etched sequentially in accordance with a fourth embodiment of the invention.
Figure 4B:
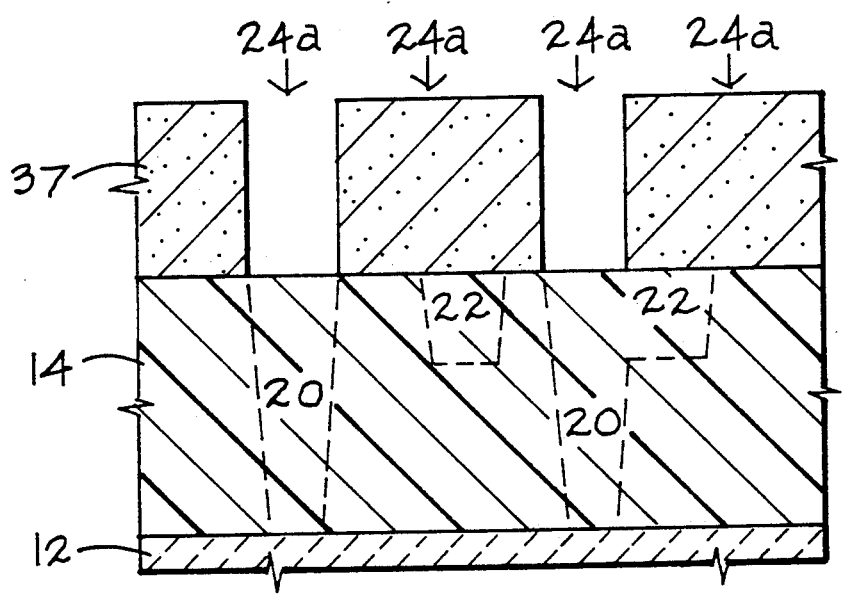
Figure 4C:
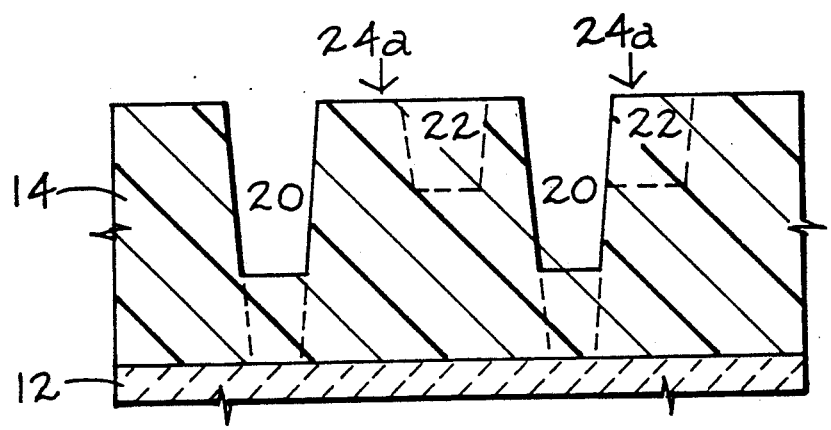
Figure 4D:
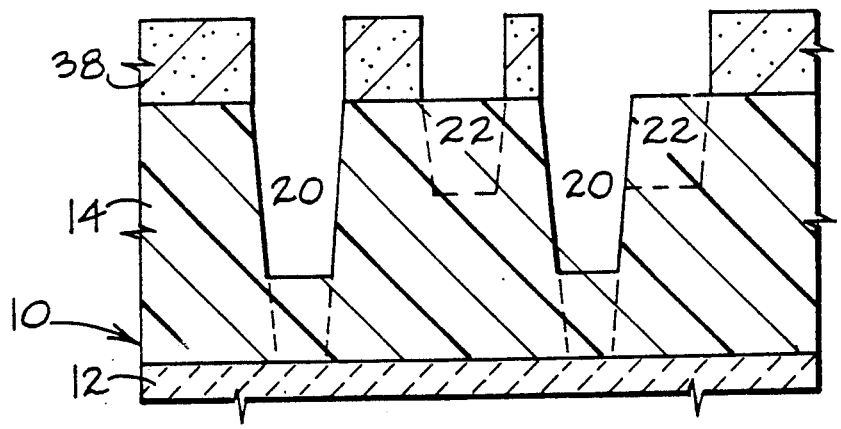
Figure 4E:
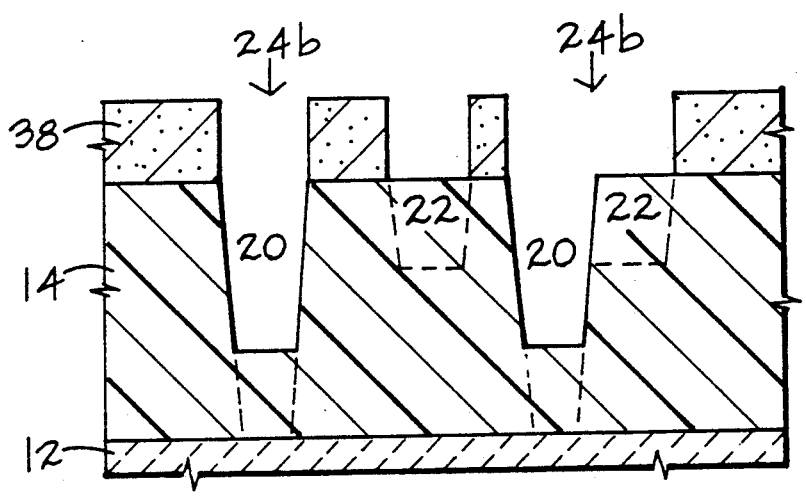
Figure 4F:
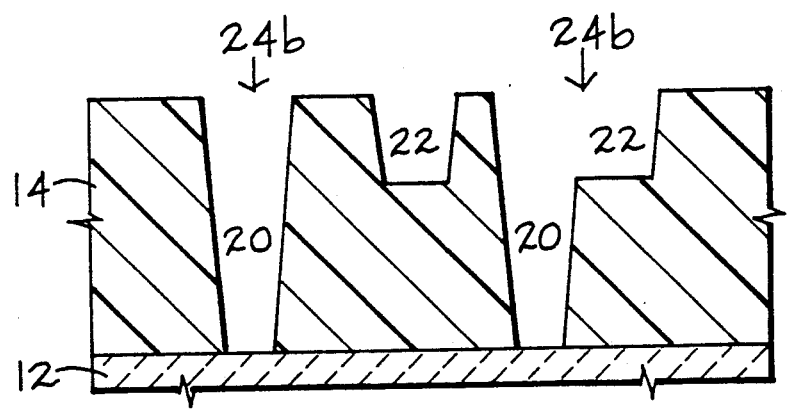
Figure 4G:
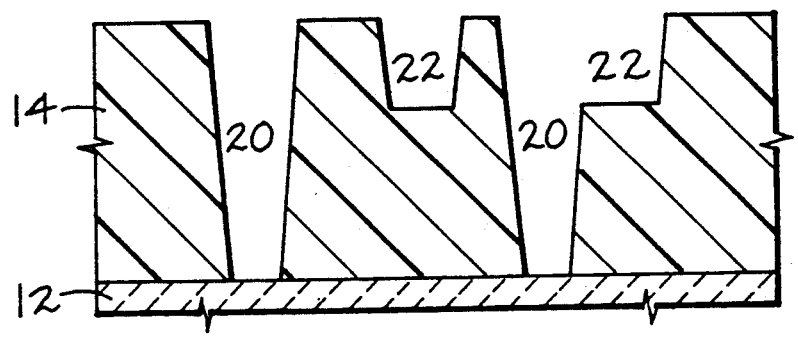
Figure 5A:
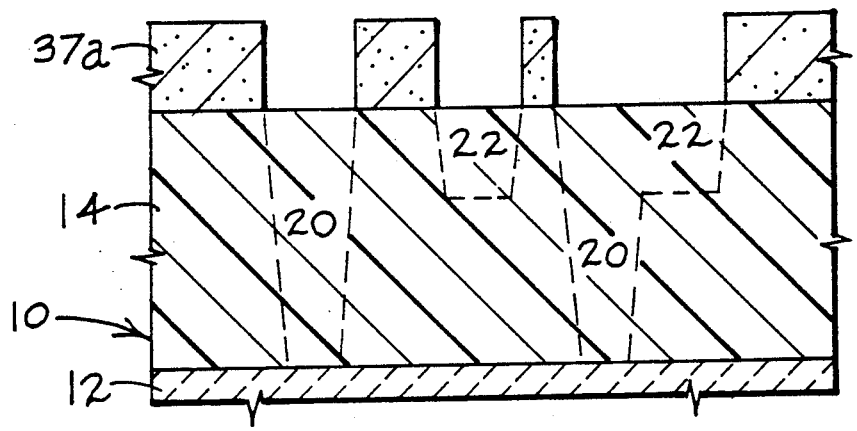
FIGS. 5a-5g are cross-sectional views detailing another method of forming the vias and channels with two soft masks applied and etched sequentially in accordance with a fifth embodiment of the invention.
Figure 5B:
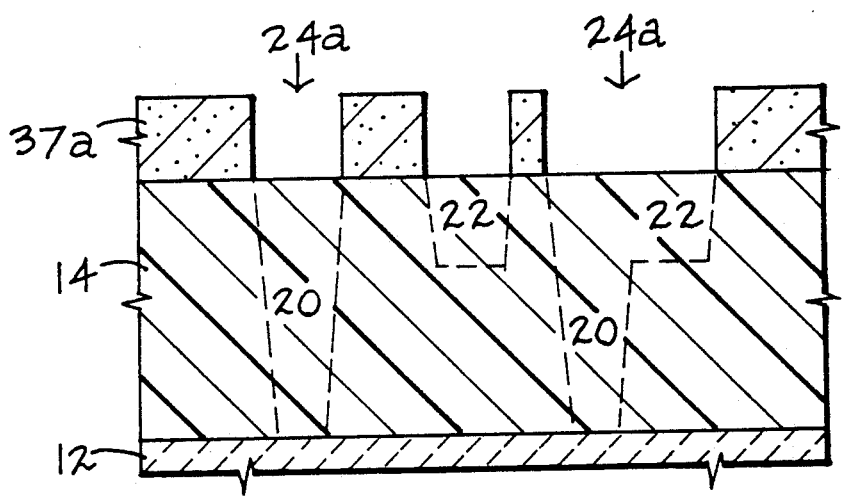
Figure 5C:
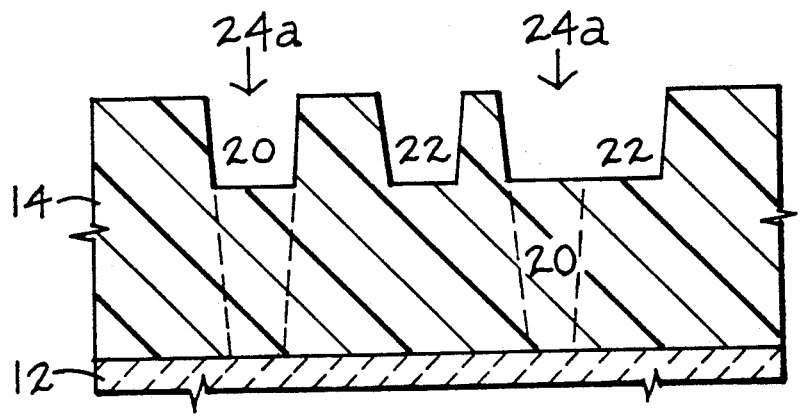
Figure 5D:
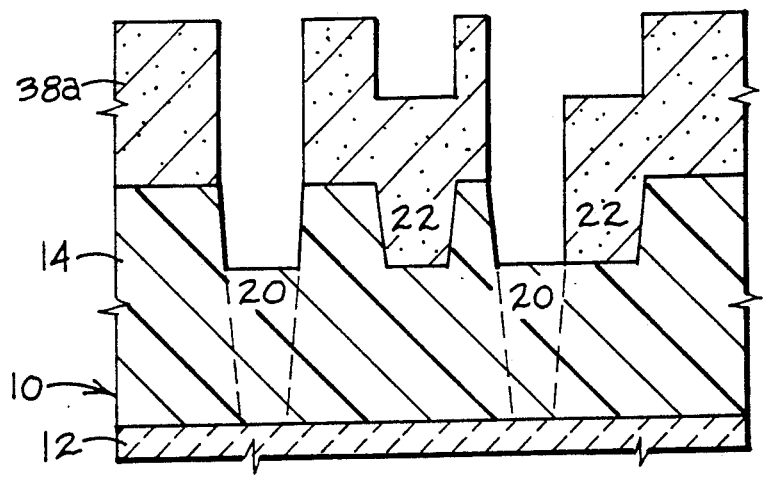
Figure 5E:
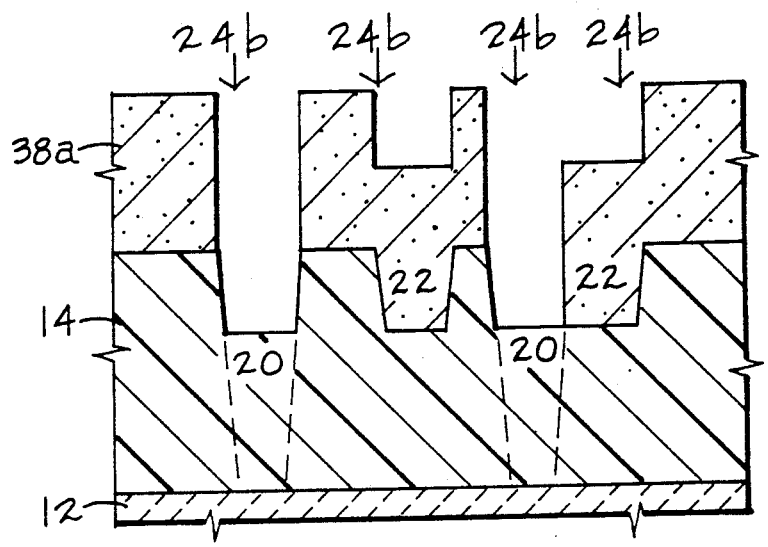
Figure 5F:
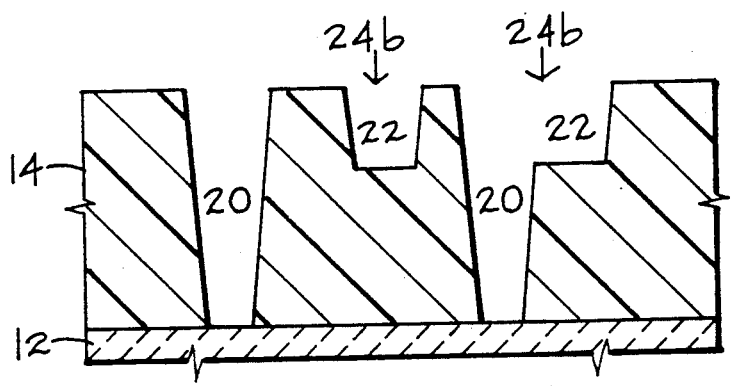
Figure 5G:
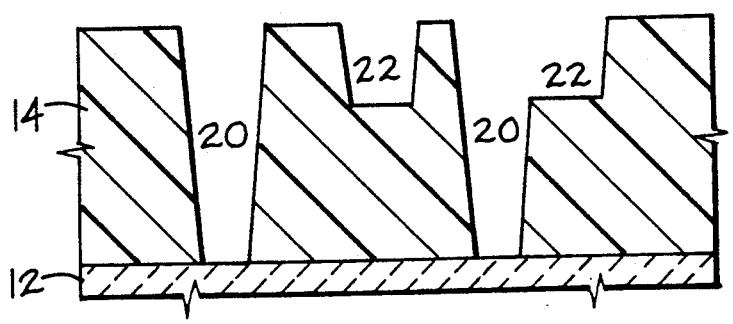

FIGS. 4a-4g show a fourth embodiment for forming the conductor channels and vias in which any description for the first embodiment in FIGS. 1a-1f is incorporated herein insofar as the same is applicable, and the same description is not repeated. FIG. 4a shows first soft mask 37, having openings exposing via regions 20, placed over polyimide layer 14 and covering channel regions 22. FIG. 4b shows first plasma etch 24a applied to first soft mask 37. As first plasma etch 24a is applied via regions 20 begin to etch and first soft mask 37 begins to erode. In FIG. 4c first soft mask 37 is either partially or completely eroded, via regions 20 are partially etched through polyimide layer 14, and channel regions 22 remain unetched. Alternatively, if desired, at this point via regions 20 can be completely etched. In FIG. 4d first plasma etch 24a is discontinued and second soft mask 38, having openings to expose via regions 20 and channel regions 22, is placed over polyimide layer 14. FIG. 4e shows second plasma etch 24b applied to second soft mask 38. Second plasma etch 24b continues. In FIG. 4f via regions 20 are etched completely through polyimide layer 14, channel regions 22 are etched partially through polyimide layer 14, and second soft mask 38 is either partially or completely eroded. In FIG. 4g second plasma etch 24b is discontinued and via regions 20 and channel regions 22 are formed. If photoresist from mask 37 or 38 remains then it is stripped.

FIFTH EMBODIMENT

Figure 15A:
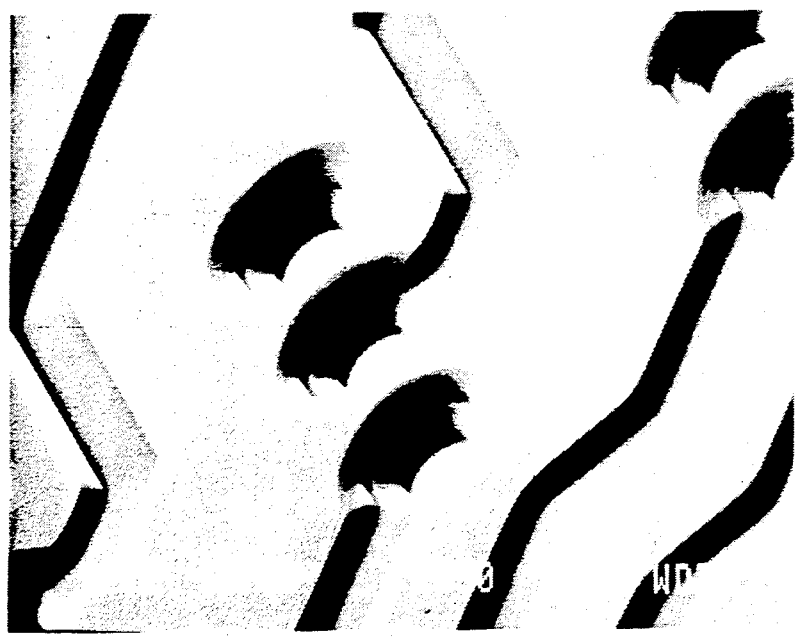
FIGS. 15a–15b are photomicrographs of vias and channels formed according to the fifth embodiment of the present invention.
Figure 15B:

FIGS. 5a-5g show a fifth embodiment for forming the conductor channels and vias which is identical to the fourth embodiment in FIGS. 4a-4g except the first and second soft masks have been switched. That is, first soft mask 37a has openings exposing via regions 20 and channel regions 22 whereas second soft mask 34a has openings exposing via regions 20 but covers channel regions 22. Consequently, via regions 20 can not be fully etched by the first etch 24a, otherwise the via and channel etching is the same as the fourth embodiment. The formation of vias and channels in a polyimide layer in accordance with the fifth embodiment was demonstrated as shown in FIGS. 15a and 15b.

SIXTH EMBODIMENT

Figure 6A:
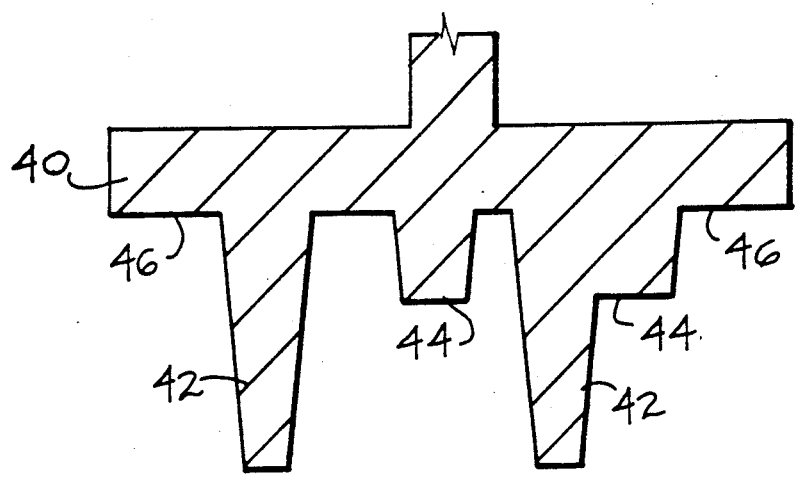
FIGS. 6a-6e are cross-sectional views detailing a method of forming the vias and channels with a metal die stamping plate in accordance with a sixth embodiment of the invention.
Figure 6A:
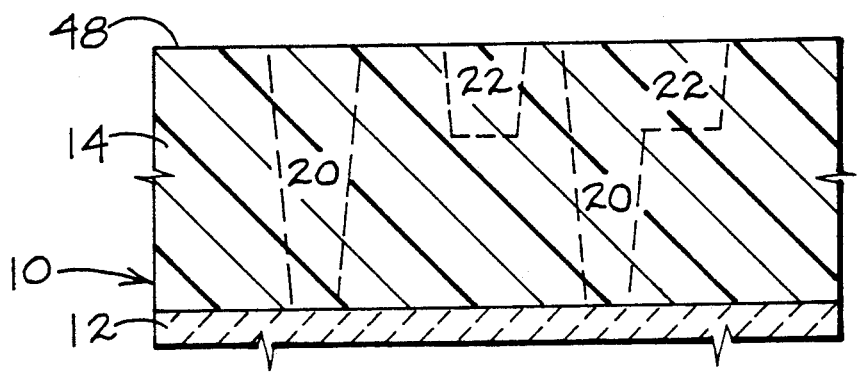
Figure 6B:
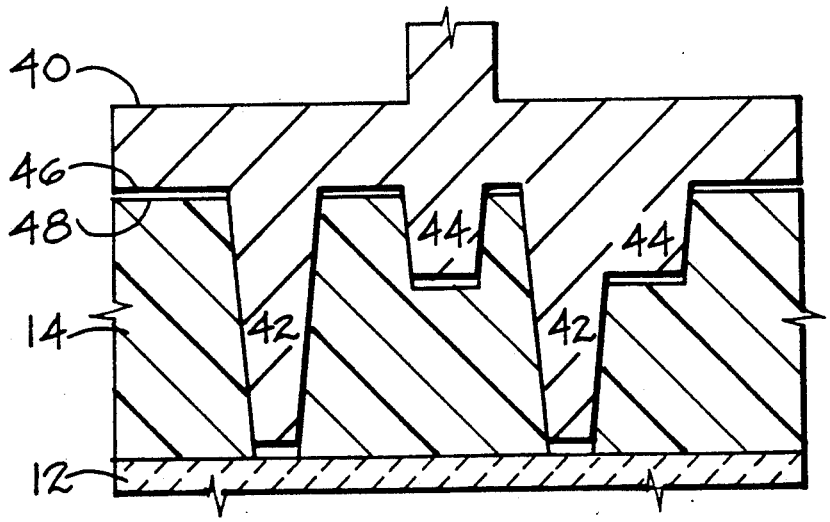
Figure 6C:
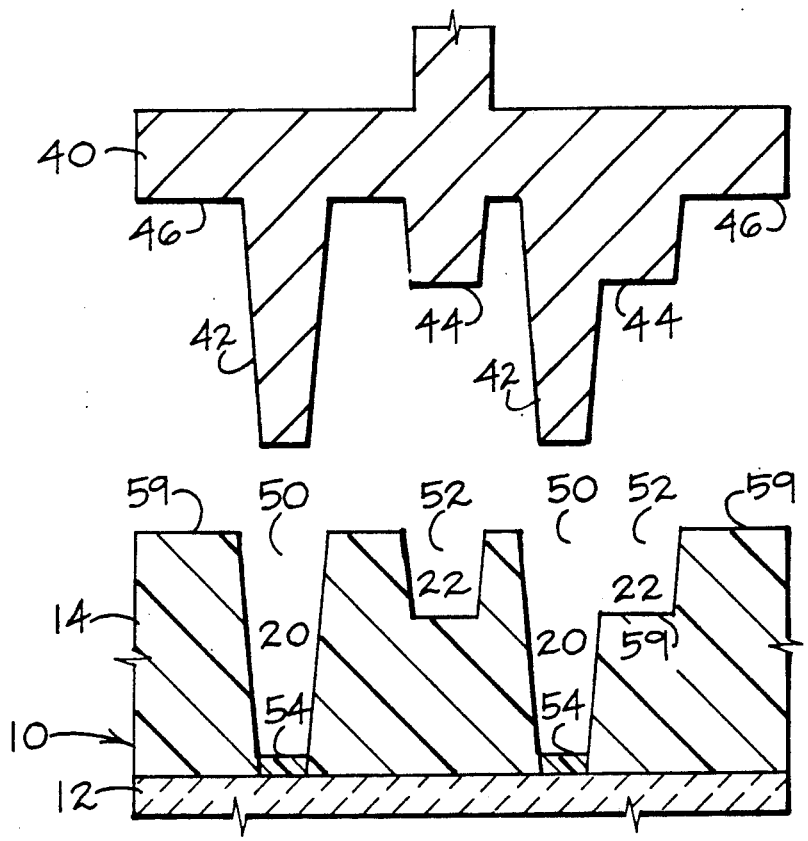
Figure 6D:
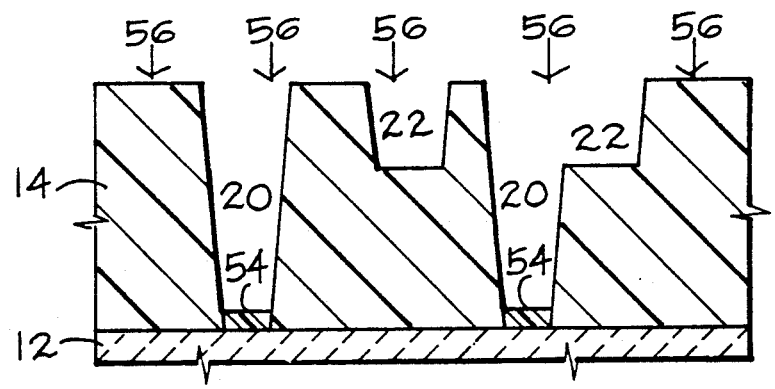
Figure 6E:
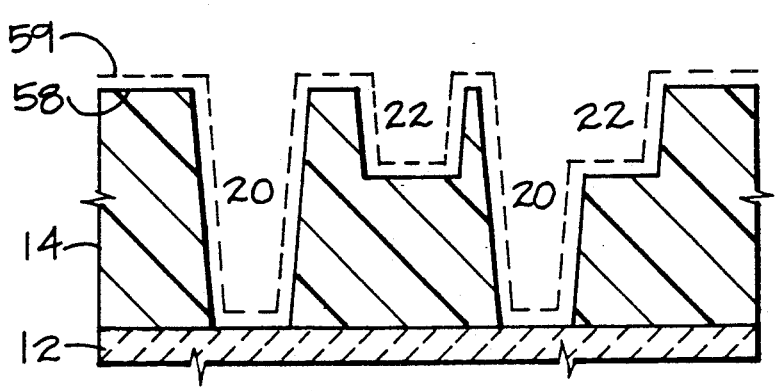

FIGS. 6a-6e show a sixth embodiment for forming the conductor channels and vias in which any description for the first embodiment in FIGS. 1a-1f is incorporated herein insofar as the same is applicable, and the same description is not repeated. In FIG. 6a die stamp plate 40 has via abutments 42 and channel abutments 44 extending from plate surface 46. Via abutments 42 and channel abutments 44 are configured to the dimensions and placement of the desired via regions 20 and channel regions 22, respectively. Unlike the first embodiment, polyimide layer 14 is not fully cured (e.g. still in liquid form or soft baked). Preferably plate 40 is heated between 150° C.-200° C. if polyimide layer 14 is in liquid form. In FIG. 6b plate 40 is stamped against polyimide layer 14 until plate surface 46 contacts top polyimide surface 48. Abutments 42 and 44 selectively displace material in polyimide layer 14. In FIG. 6c plate 40 is retracted leaving via indentations 50 and channel indentations 52 in polyimide layer 14. Since excess polyimide 54 is likely to remain in via regions 20 beneath via indentations 50 it will be necessary to remove excess polyimide 54 to assure reliable interconnection between the conductive metal to be placed in the via and the underlying surface. In FIG. 6d a brief descumming plasma etch 56 similar to plasma etch 24 is applied to polyimide layer 14 in order to remove excess polyimide 54 and properly form via regions 20. In FIG. 6e brief descumming plasma etch 56 is discontinued. Post-etch surface 58 is slightly and uniformly lower than pre-etch surface 59 (shown as the broken line) by the thickness of excess polyimide 54. The relaxed requirements of brief descumming etch 56 allow a wide variety of preferred etches, such as plasma, wet chemistry, and photoablation. An alternative polymeric insulator such as epoxy may be advantageous due to the relatively low cost, low cure temperature and short cure time as compared to polyimide. Forming vias and channels by stamping the insulator with a plate may be advantageous for vias and channels with large geometries.

SEVENTH EMBODIMENT

Figure 7A:
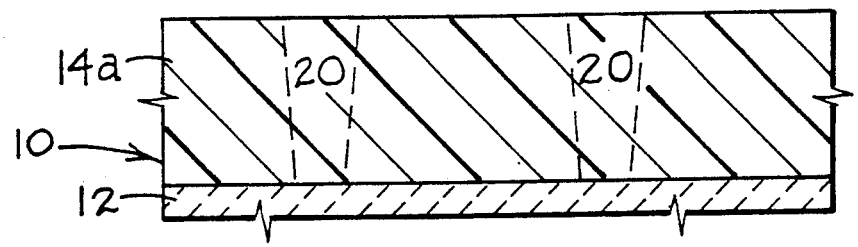
FIGS. 7a-7f are cross-sectional views detailing a method of forming the vias and channels with two layers of photoimagible polyimide in accordance with a seventh embodiment of the invention.
Figure 7B:
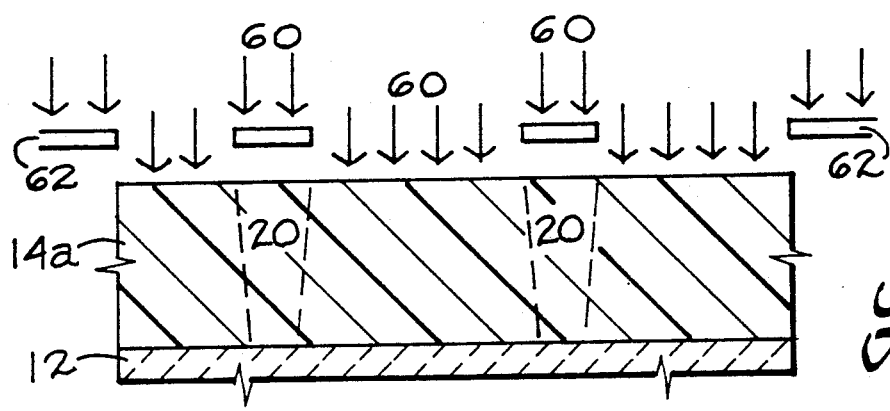
Figure 7C:
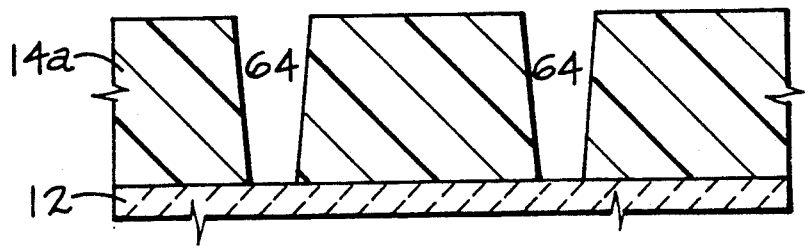
Figure 7D:
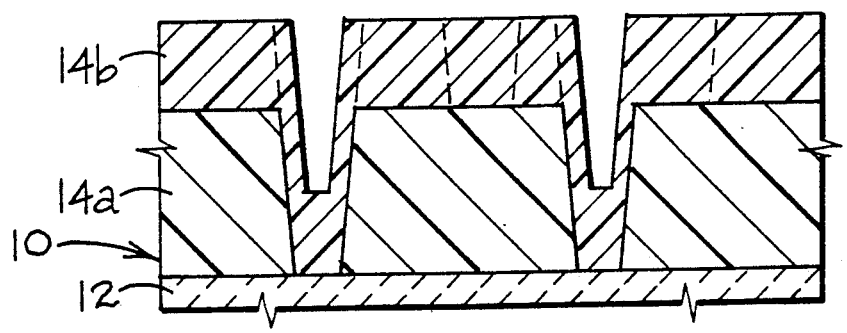
Figure 7E:
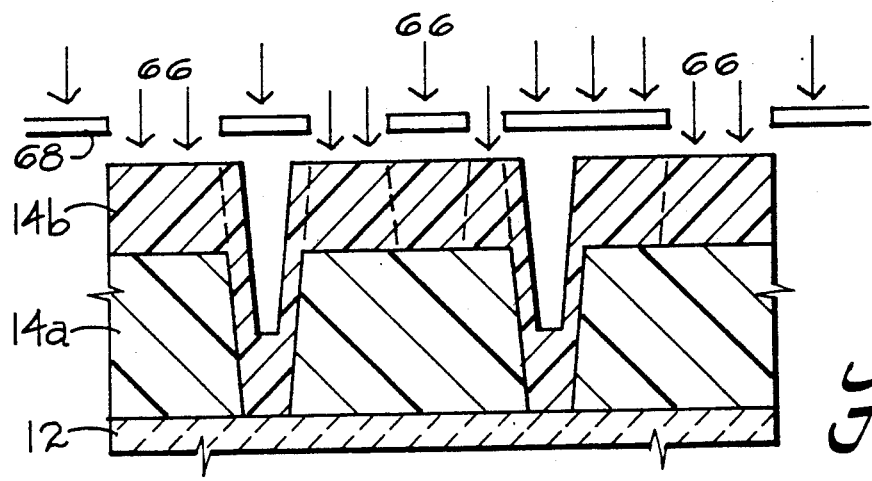
Figure 7F:
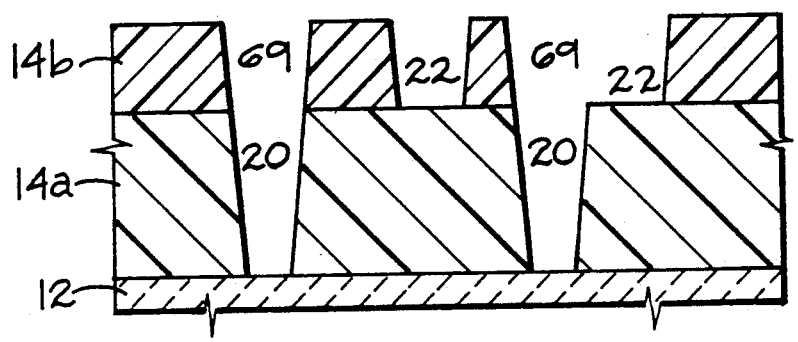

FIGS. 7a-7f show a seventh embodiment for forming the conductor channels and vias by photodefinition in which any description for the first embodiment in FIGS. 1a-1f is incorporated herein insofar as the same is applicable, and the same description is not repeated. In FIG. 7a over base 12 is provided a first photoimagible layer such as photoimagible polymeric having a thickness that defines the distance from the bottom of channel region 22 to the top of base 12, shown as an uncured 10 micron thick first photoimagible polyimide layer 14a. The use of photoimagible polyimide is conventional, see for instance K. K. Chakravorty et al, "Photosensitive Polyimide as a Dielectric in High Density Thin Film Copper-Polyimide Interconnect Structures", *The Electrochemical Society Extended Abstracts*, Vol. 88-1, Abstract No. 54, pp. 77-78 (May, 1988). In FIG. 7b first photoimagible polyimide layer 14a is selectively exposed to first mercury light 60 through first mask 62 which defines the vias in order to selectively alter the solubility of the exposed polyimide 14a. Preferably, as shown a negative process is used wherein the exposed polyimide 14a is outside via regions 20 and is rendered insoluable from irradiation, whereas the unexposed non-irradiated polyimide 14a in via regions 20 remains soluble. In FIG. 7c first mercury light 60 is discontinued and the soluble polyimide 14a is removed to form openings 64 in lower 10 microns of via regions 20. A soft bake can be applied to polyimide layer 14a to render it harder for further processing. In FIG. 7d a 5 micron thick second photoimagible layer shown as uncured photoimagible polyimide layer 14b is provided over layer 14a, wherein the thickness of layer 14b defines the depth of channel regions 22. In FIG. 7e second photoimagible polyimide layer 14b is selectively exposed to second mercury light 66 through second mask 68 to render insoluable the exposed irradiated polyimide 14b outside via regions 20 and channel regions 22. In FIG. 7f second mercury light 66 is discontinued and the soluble polyimide 14b is then removed to form openings in channels 22 and upper portions 69 of via regions 20. Thereafter photoimagible polyimide layers 14a and 14b are fully cured. If desired a brief descumming etch 56 (not shown) may be applied. In the seventh embodiment two separate photoimagible insulating layers are necessary to form the vias and channels in a plane, however, the two layers can advantageously be coatings of the same material unlike the use of a separate etch-stop material in the prior art. The seventh embodiment has the advantages that the photodefinition of the vias and channels takes place in the final substrate insulating layer rather than a mask, and the need for a separate etch step is eliminated.

EIGHTH EMBODIMENT

Figure 8A:
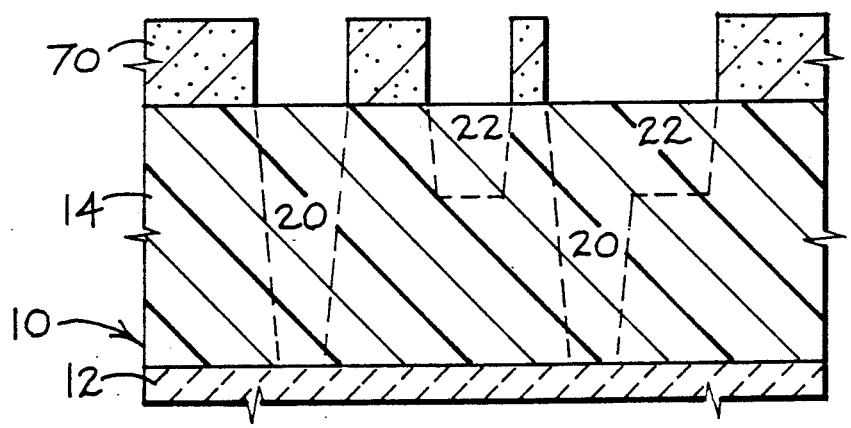
FIGS. 8a-8f are cross-sectional views detailing a method of forming the vias and channels with a mask followed by laser drilling in accordance with an eighth embodiment of the invention.
Figure 8B:
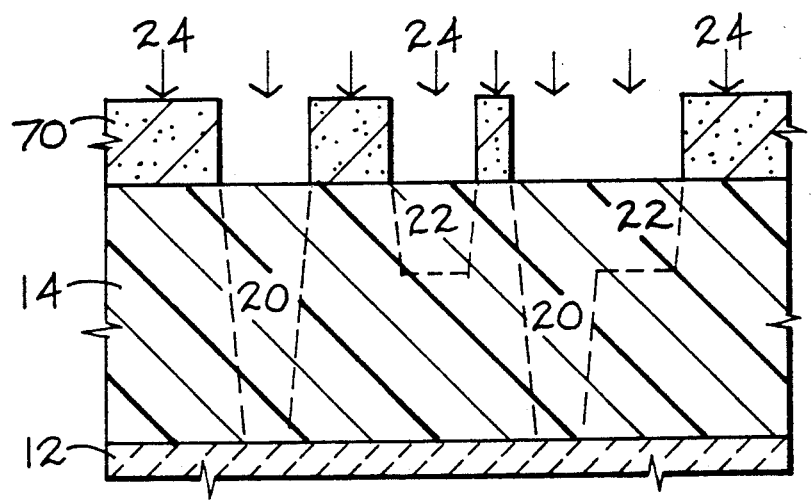
Figure 8C:
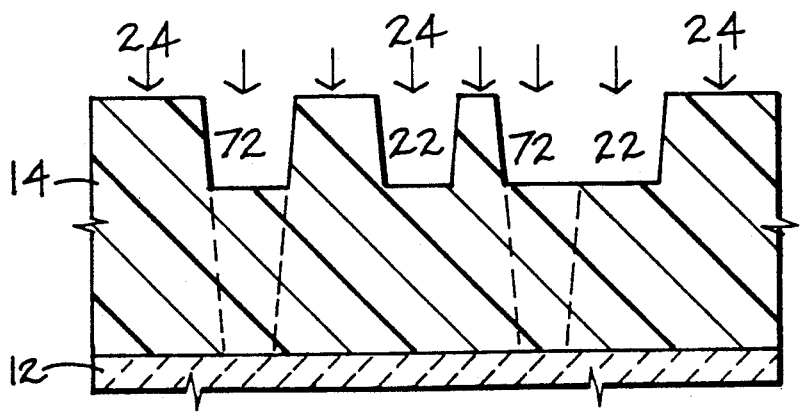
Figure 8D:
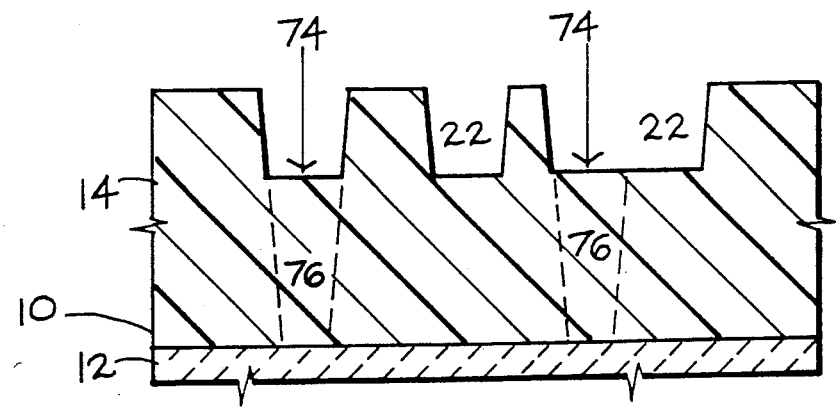
Figure 8E:
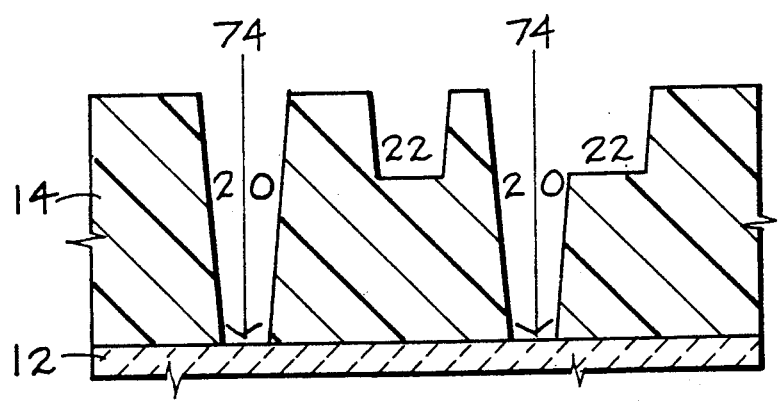
Figure 8F:
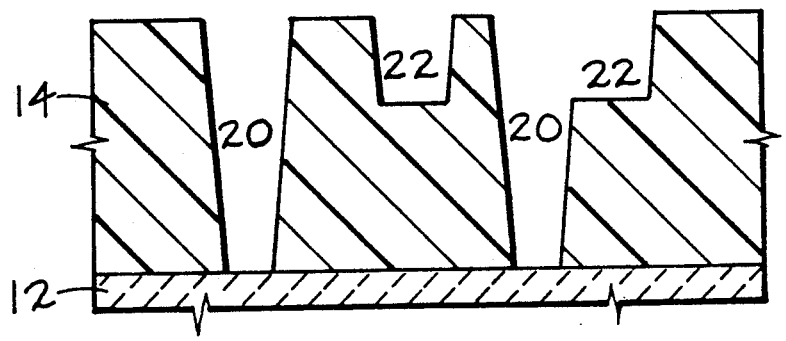

FIGS. 8a-8f show a eighth embodiment for forming the conductor channels and vias in which any description for the first embodiment in FIGS. 1a-1f is incorporated herein insofar as the same is applicable, and the same description is not repeated. In FIG. 8a a mask 70 is placed over polyimide layer 14, and then patternwise developed to have openings exposing via regions 20 and channel regions 22. For illustration purposes mask 70 will be a soft mask. While a hard mask is also suitable, soft mask 70 is preferred since after it erodes the plasma roughens the exposed surface of polyimide layer 14 which increases adhesion to subsequently applied materials. In FIG. 8b plasma etch 24 is applied. In FIG. 8c channel regions 22 and upper portions 72 of via regions 20 are formed, and soft mask 70 is completely eroded. In FIG. 8d plasma etch 24 is discontinued and laser beam 74 is applied from a $CO_2$ laser source to thermally ablate and remove insulating material from the lower portions 76 of via regions 20. The power of laser beam 74 can vary widely since unlike the channels there is not critical depth control for the vias and the underlying polyimide is essentially drilled-out. In FIG. 8e via regions 20 are formed. In FIG. 8f laser beam 74 is discontinued. Thereafter a brief descumming etch 56 (not shown) may be applied if desired.

After via regions 20 and channel regions 22 are formed there are many ways of depositing an electrically conducting layer into the via and channel including electrolytic deposition, electroless deposition, evaporation, sputtering, and squeegeeing. By way of example, unless otherwise noted electrolytic deposition is described for FIGS. 9a-9b and FIGS. 10a-10c.

Figure 9A:
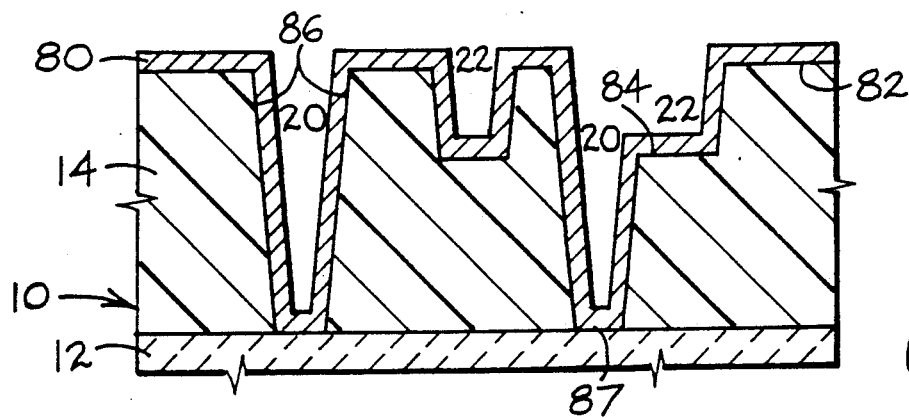
FIGS. 9a-9b are cross-sectional views detailing a method of depositing an electrical conductor in the vias and channels.

Referring now to FIG. 9a, after via regions 20 and channel regions 22 have been removed from polyimide layer 14, seed layer 80 of 2500 angstroms copper over 700 angstroms chrome is sputter deposited over top surface 82 of polyimide layer 14, walls 84 of channel regions 22, sidewalls 86 of vias 20, and base regions 87 exposed beneath vias regions 20. That is, seed layer 80 covers the entire surface of substrate 10 to provide adhesion for subsequent electrolytic deposition of an electrical conductor. While seed layer 80 will provide a more uniform coverage of via sidewalls 86 when they are sloped, should via sidewalls 86 be vertical then sputtered seed layer 80 would be thinner but still of sufficient thickness.

Figure 9B:
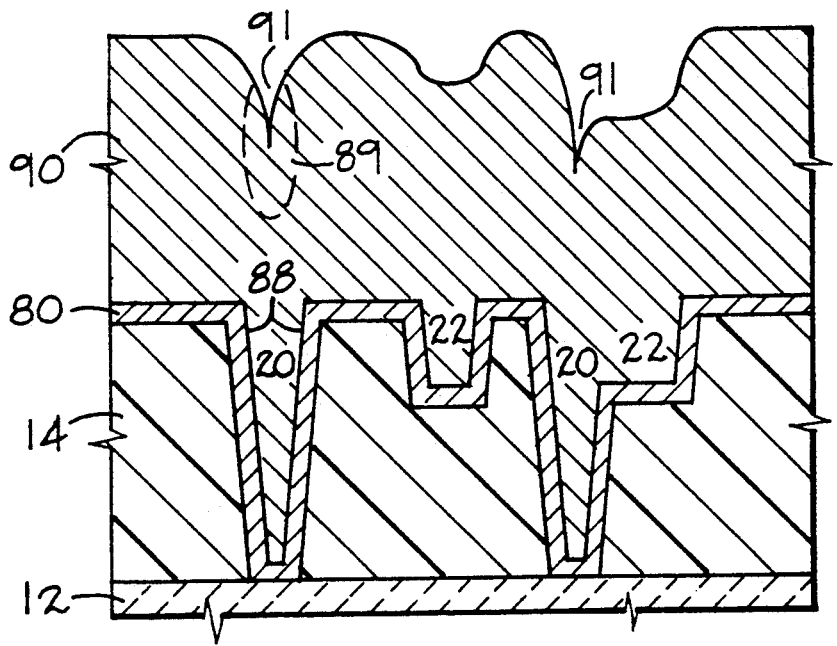

In FIG. 9b electrically conductive layer 90 such as copper is electrolytically deposited over the entire seed layer 80 so that the electrically conductive layer 90 fills via regions 20 and channel regions 22. Electrically conductive layer 90 is preferably the same thickness as the deepest via region 20 to assure via regions 20 are entirely filled to the top of polyimide layer 14 since valleys 91 are likely to form in electrically conductive layer 90 above via regions 20. In this example polyimide layer 14 (and thus initially via regions 20) are 15 microns thick and seed layer 80 is very thin, therefore after seed layer 80 is deposited the deepest via region 20 and the preferred thickness of electrically conductive layer 90 is about 15 microns. Should electrically conductive layer 90 be thicker than 15 microns then additional planarization will be required as described in FIGS. 11a-11c. Should electrically conductive layer 90 be thinner than 15 microns then via regions 20 may not be entirely filled; however, if electrically conductive layer 90 substantially fills via regions 20, such as by covering sidewalls 88 with pit 89 therebetween, then proper electrical interconnection can still be made between conductors 90 in via region 20 and an overlaying conductor. During electrodeposition, high current densities at the top edges of the trenches may cause ridge build-up of the conductive material thereon which blocks the conductive material from filling the trenches. In this case reverse pulse plating can be used during electrodeposition to continually shave back ridge build-ups.

Figure 10A:
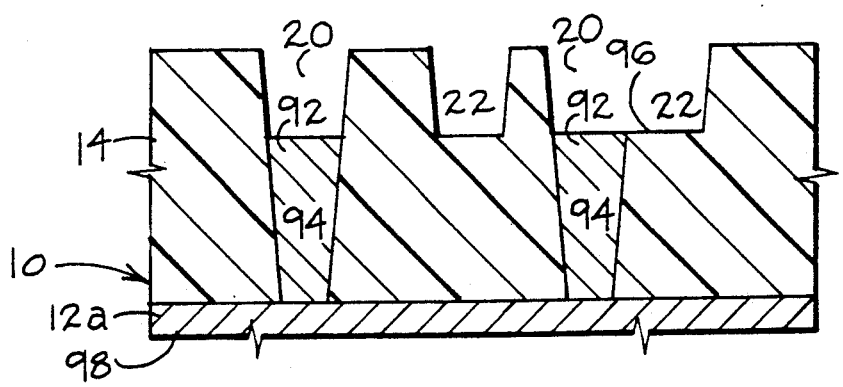
FIGS. 10a-10c are cross-sectional views detailing another method of depositing an electrical conductor in the vias and channels.
Figure 10B:
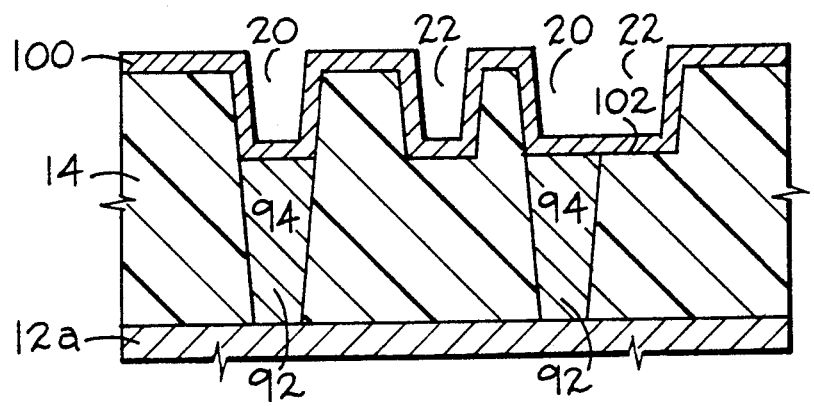
Figure 10C:
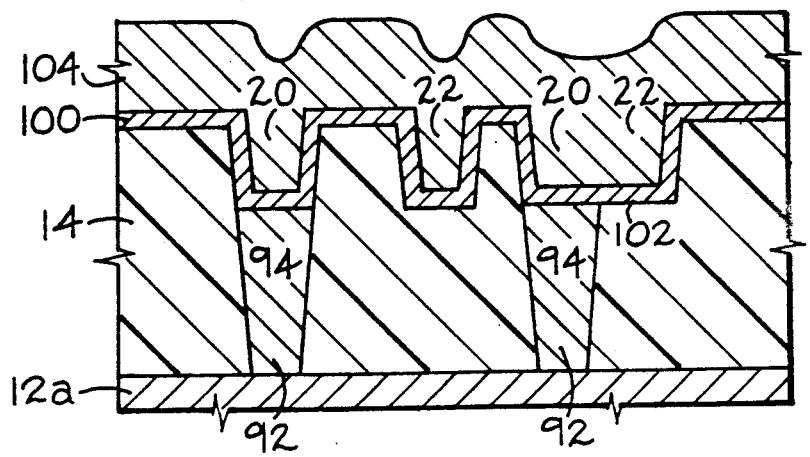

In FIGS. 10a–10c another method is shown for depositing conductors in the channels and vias. A first electrical conductor 92 is plated, preferably by electroless deposition, into the vias in lower regions 94 which extend to bottom surface 96 of channel regions 22, wherein an electrically conductive base 12a can serve as a first seed layer 98. In FIG. 8b second seed layer 100 is sputtered over intermediate surface 102. In FIG. 8c second electrically conductive layer 104 is electrolytically deposited over second seed layer 100. It is noted that since the lower via regions 94 are already filled with first electrical conductor 92 it is only necessary to deposit 5 microns of second electrical conductor 104 in order to assure that via regions 20 and channel regions 22 are filled. This is advantageous since 10 microns less of electrical conductor will need to be removed above polyimide layer 14 then if the vias and channels are filled with a single 15 micron conductive layer as shown in FIG. 9b.

Alternatively, the electrical conductors 90, 92 and/or 104 can be deposited by other processes such as evaporation or sputtering which may obviate the need for seed layers 80, 98 and/or 100, respectively. While evaporation is faster than sputtering, sputtering may be preferred for thin metallization, for instance if the vias and channels have been formed in an integrated circuit.

Another method for depositing the conductors in the channels and vias is electroless deposition (not shown). The insulating layer must first be treated to be receptive to an electroless plating bath. U.S. Pat. No. 4,701,351 by Jackson discloses a seeding process for electroless metal deposition in which a substrate is coated with a thin (1 micron) layer of a polymer which complexes with a noble metal compound, and the layer of polymer is contacted with a noble metal compound to form a complexed polymer. Thereafter the substrate is placed in an electroless plating bath. A mask can be used to expose selected regions of the polymer to the noble metal compound and/or electroless plating bath. After electroless deposition the substrate surface is planarized such as by polishing. An advantage of electroless deposition is that the pre-deposition treatment layer need not be a conductor. A disadvantage of the predeposition polymer treatment in Jackson is that the polymer seed layer does not typically adhere to the substrate as well as a sputtered conductor seed layer. As compared to electrolytic deposition, electroless deposition tends to provide more uniform coverage but the process takes more time.

Another way (not shown) of filling the vias and channels with a conductor is by squeegeeing a liquid metal or metal paste across the surface. After squeegeeing the liquid metal may stay clear of the polyimide surface. In the likely event excess liquid metal remains on the substrate surface it must be removed, as by lightly laping the substrate surface to assure a planarized and non-short-circuited substrate top surface. A disadvantage of squeegeeing is that liquid metals are not as conductive as, say, copper, and thereby may seriously degrade the performance of high density substrates with fine line pitches.

Figure 11A:
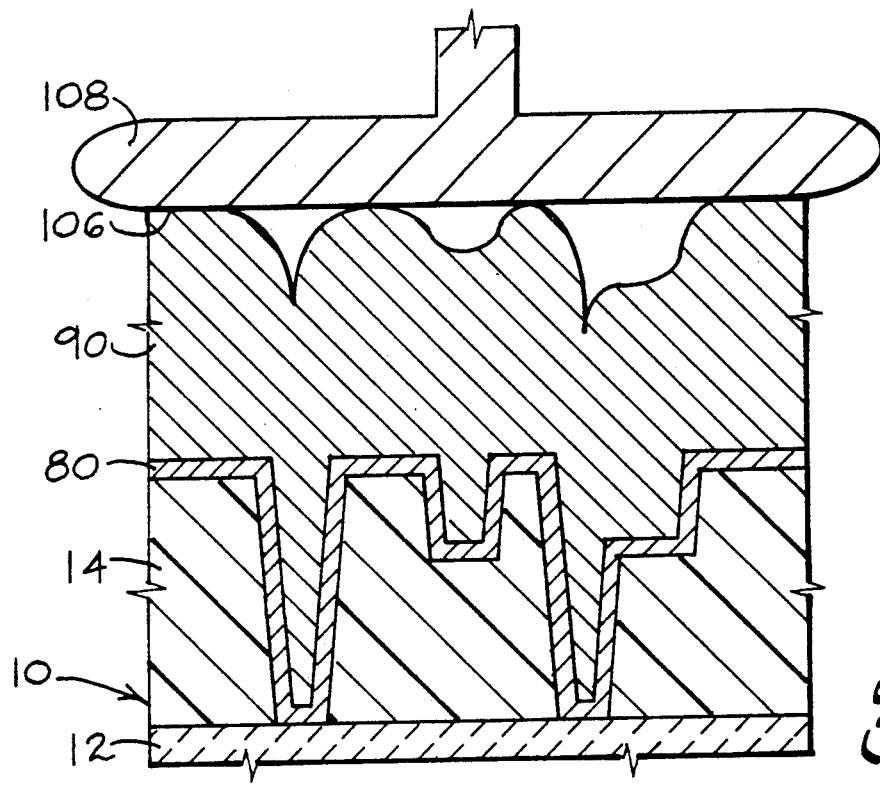
FIGS. 11a-11c are cross-sectional views detailing planarizing the substrate top surface by polishing.
Figure 11B:
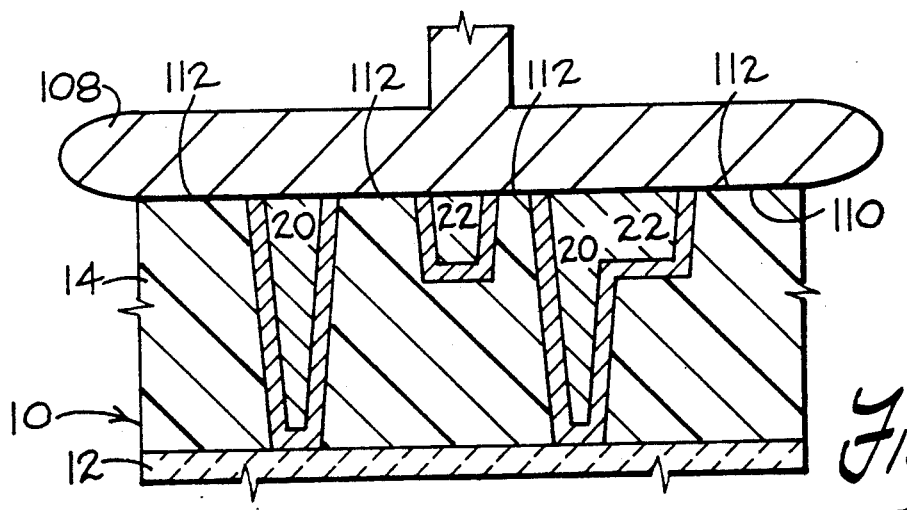
Figure 11C:
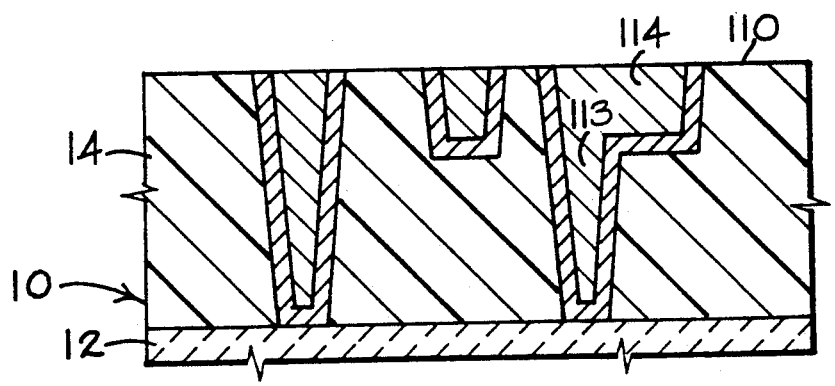

Referring now to FIGS. 11a–11c, the final step of the present invention is planarizing the substrate top surface until electrical conductor 90 remains only in the channels and the vias and the substrate top surface is substantially smooth. For illustration purposes a substrate with seed layer 80 and electrically conductive layer 90 deposited in accordance with FIGS. 9a–9b will be shown. In FIG. 11a top surface 106 of substrate 10 is contacted by polishing means 108 to begin planarization. The polishing should not locally conform to the unevenness in conductor 90 but rather shave off the highest parts of conductor 90 with little or no removal of material elsewhere. Polishing can be performed by mechanical polishing, mechanical/chemical polishing, electropolishing and the like. Mechanical polishing and mechanical/chemical polishing of polyimide are well known in the art and will not be detailed herein. Electropolishing is also known in the art, for instance R. J. Contolini et al in "Embedded Conductors by Electrochemical Planarization", Abstract No. 184, *Abstracts From the Spring Electrochemical Society Meeting, Los Angeles, Ca, May* 7, 1989 discuss a process which can produce planarized multilayer interconnects incorporating vertical-walled conductors that is applicable to any metal which can be electroplated and electropolished, such as copper and gold. See also C. W. Koburger, "Trench Planarization Technique", *IBM Technical Disclosure Bulletin*, Vol. 27, No. 6, pp. 3242–3243 (November, 1984) in which a nonselective etch is used to etch a trench structure just past the original surface, resulting in a surface that is neither roughened nor otherwise degraded by the etch. In FIG. 11b polishing means 108 is actuated toward substrate 10 and planarly removes the top of substrate 10 until contact is made with top surface 110 of polyimide layer 14. Seed layer 80 and electrically conductive layer 90 are thus removed by polishing means 108 from the non-via/non-channel regions 112 on top surface 110. That is, seed layer 80 and electrically conductive layer 90 are shaved back until they substantially fill via regions 20 and channel regions 22 but do not extend above polyimide layer 14. In FIG. 11c polishing means 108 is retracted. Polishing can be discontinued a fixed time 109 after polyimide layer 14 is exposed, and fixed time 109 can be selected so that only a negligible amount of polyimide will be removed. Optionally, a brief plasma etch-back (not shown) of the polished polyimide surface may be applied to provide roughening and thereby improve adhesion to subsequently deposited materials. The top surface 110 of substrate 10 is substantially smooth and electrically conductive via 112 is adjacent and interconnected to electrically conductive channel 114.

Figure 12:
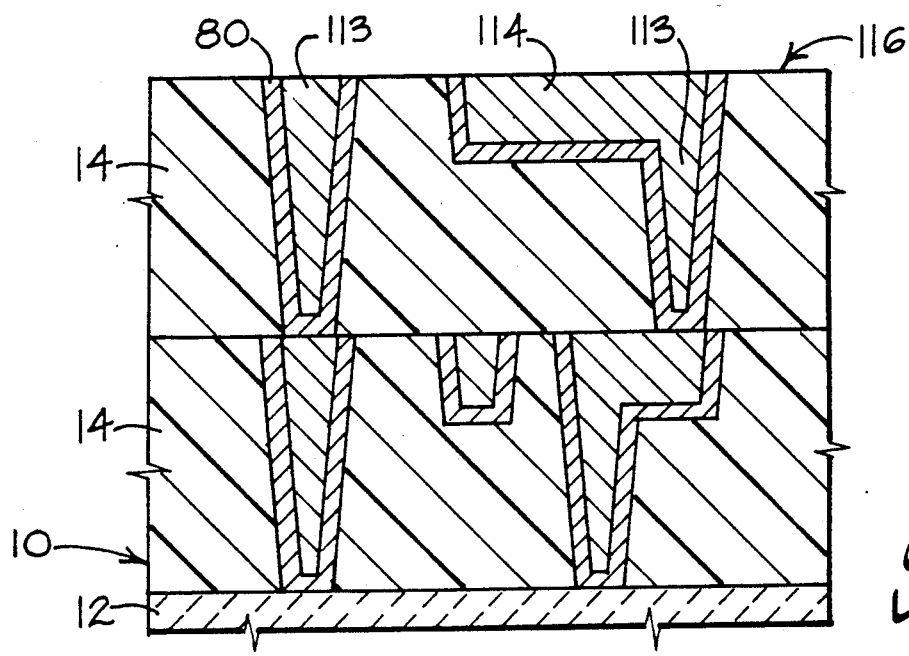
FIG. 12 is a cross-sectional view showing via stacking in a multilayer electrical interconnect.

Referring now to FIG. 12, substrate 10 can be fabricated into a multilayer electrical interconnect 116 with stacked vias by repeating the above steps.

Figure 13:
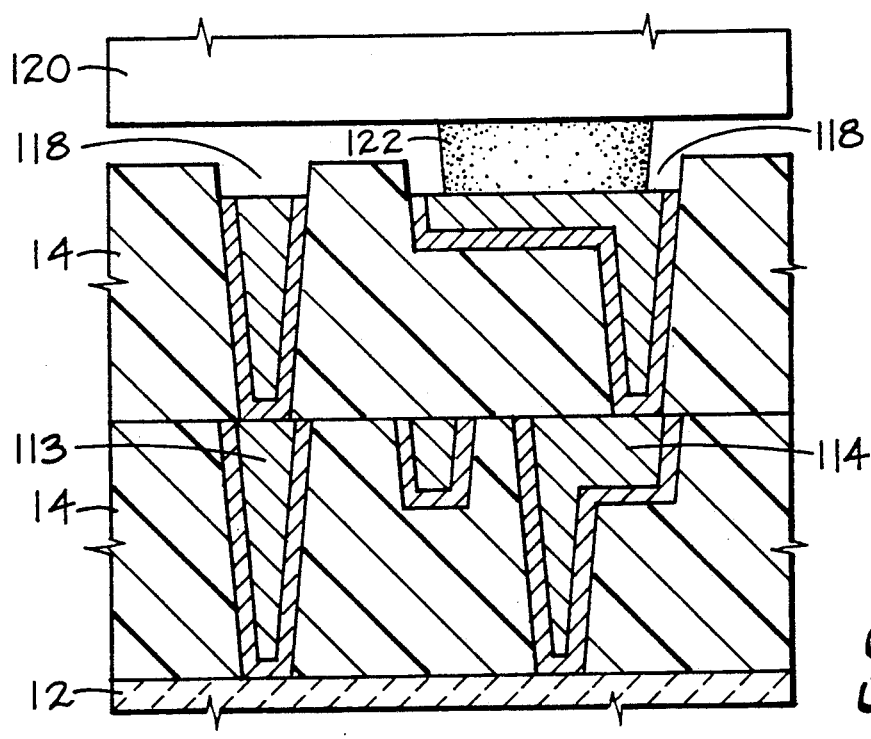
FIG. 13 is a cross-sectional view similar to FIG. 12 showing the conductors in the top layer slightly etched back to provide registration for bumps on an integrated circuit.

In FIG. 13 conductor 90 is etched-back a slight distance 118 to provide registration for electrical component 120 containing conductive bumps 122.

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What I claim is:

1. A method for fabricating a multilayer electrical interconnect, comprising the following steps in the sequence set forth:

(a) providing an insulating layer on a base;

(b) forming a channel in the top surface and partially through the thickness of the insulating layer;

(c) forming a via in the top surface and completely through the thickness of the insulating layer adjacent the channel;

wherein forming the channel and via in steps (b) and (c) comprises:

covering the insulating layer with a hard mask having an opening to expose the channel and via, wherein the hard mask is non-erodible by an etch;

covering the hard mask with a soft mask having an opening to expose the via but covering the channel, wherein the soft mask is erodible by an etch;

applying an etch to remove material from the insulating layer where the via is exposed until the soft mask is completely eroded;

applying the etch after the soft mask is completely eroded to remove material from the insulating layer where the channel is exposed and material from the insulating layer remaining where the via is exposed until the channel and via are etched; and then removing the hard mask from the insulating layer, thereby forming the channel and via in the same step;

(d) depositing an electrical conductor into the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

2. The method of claim 1 wherein the etch is performed by photoablation.

3. The method of claim 1 wherein the etch is performed by plasma etching.

4. The method of claim 1 wherein insulating layer is polyimide.

5. The method of claim 1 wherein the soft mask is a material selected from the group consisting of photoresist, silicon-dioxide, and silicon-nitride.

6. The method of claim 1 wherein the hard mark is a metal.

7. A method for fabricating a multilayer electrical interconnect, comprising the following steps in the sequence set forth:

(a) providing an insulating layer on a base;

(b) forming a channel in the top surface and partially through the thickness of the insulating layer;

(c) forming a via in the top surface and completely through the thickness of the insulating layer adjacent the channel;

wherein forming the channel and via in steps (b) and (c) comprises:

covering the insulating layer with a lower soft mask having an opening to expose the channel and via, wherein the lower soft mask is erodible by an etch;

covering the lower soft mask with an upper soft mask having an opening to expose the via but covering the channel, wherein the upper soft mask is erodible by an etch;

applying an etch to remove material from the insulating layer where the via is exposed until the upper soft mask is either partially or completely eroded; and applying the etch after the upper soft mask is either partially or completely eroded to remove material from the insulating layer where the channel is exposed and material from the insulating layer remaining where the via is exposed until the lower soft mask is either partially or completely eroded and the channel and via are etched, thereby forming the channel and via in the same step;

(d) depositing an electrical conductor into the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnect to an electrically conducting via.

8. The method of claim 7 wherein the etch is performed by photoablation.

9. The method of claim 7 wherein the etch is performed by plasma etching.

10. The method of claim 7 wherein the insulating layer is polyimide and the upper and lower soft masks are a material selected from the group consisting of photoresist, silicon-dioxide, and silicon-nitride, and further comprising the step of:

removing any portions of the first or second soft masks that remain on the substrate top surface after the etch.

11. A method for fabricating a multilayer electrical interconnect, comprising the following steps in the sequence set forth:

(a) providing an insulating layer on a base;

(b) forming a channel in the top surface and partially through the thickness of the insulating layer;

(c) forming a via in the top surface and completely through the thickness of the insulating layer adjacent the channel;

wherein forming the channel and via in steps (b) and (c) comprises:

covering the insulating layer with a first soft mask having an opening to expose the via but covering the channel, wherein the first soft mask is erodible by a first etch;

applying a first etch to remove material from the insulating layer where the via is exposed and to either partially or completely erode the first soft mask;

covering the insulating layer with a second soft mask having an opening to expose the channel and via, wherein the second soft mask is erodible by a second etch; and applying a second etch to remove material from the insulating layer where the channel is exposed and material from the insulating layer remaining where the via is exposed until the second soft mask is either partially or completely eroded and the channel and via are etched, thereby forming the channel and via;

(d) depositing an electrical conductor into the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnect to an electrically conducting via.

12. The method of claim 11 wherein the first and second etches are performed by photoablation.

13. The method of claim 11 wherein the first and second etches are performed by plasma etching.

14. The method of claim 11 wherein the insulating layer is polyimide and the first and second soft masks are a material selected from the group consisting of photoresist, silicon-dioxide, and silicon-nitride, and further comprising the step of:

removing any portions of the first or second soft masks that remain on the substrate top surface after the second etch.

15. A method for fabricating a multilayer electrical interconnect, comprising the following steps in the sequence set forth:

(a) providing an insulating layer on a base;
(b) forming a channel in the top surface and partially through the thickness of the insulating layer;
(c) forming a via in the top surface and completely through the thickness of the insulating layer adjacent the channel;

wherein forming the channel and via in steps (b) and (c) comprises:

covering the insulating layer with a first soft mask having an opening to expose the via and channel, wherein the first soft mask is erodible by a first etch;

applying a first etch to remove material from the insulating layer where the channel and via are exposed and to either partially or completely erode the first soft mask;

covering the insulating layer with a second soft mask having an opening to expose the via but covering the channel, wherein the second soft mask is erodible by a second etch; and applying a second etch to remove material from the insulating layer remaining where the via is exposed until the second soft mask is either partially or completely eroded and the channel and via are etched, thereby forming the channel and via;

(d) depositing a seed layer over the interconnect and into the channel and via, and then depositing an electrical conductor over the seed layer and into the channel and via wherein the deposited conductor substantially fills the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

16. The method of claim 15 wherein the first and second etches are performed by photoablation.

17. The method of claim 15 wherein the first and second etches are performed by plasma etching.

18. The method of claim 15 wherein the insulating layer is polyimide and the first and second soft masks are a material selected from the group consisting of photoresist, silicon-dioxide, and silicon-nitride, and further comprising the step of:

removing any portions of the first or second soft masks that remains on the substrate top surface after the second etch.

19. A method for fabricating a multilayer electrical interconnect, comprising the following steps in the sequence set forth:

(a) providing an insulating layer on a base;
(b) forming a channel in the top surface and partially through the thickness of the insulating layer;
(c) forming a via in the top surface and completely through the thickness of the insulating layer adjacent the channel;

wherein forming the channel and via in steps (b) and (c) comprises:

stamping the insulating layer with a patterned plate comprising a channel abutment and a via abutment extending from a plate surface, so that the surface plate contacts the insulating layer, the channel abutment forms a channel indentation, and the via abutment forms a via indentation deeper than the channel indentation in the insulating layer;

retracting the plate from the insulating layer; and applying an etch to the interconnect to remove residual material from the insulating layer beneath the via indentation until the via is etched, thereby forming the channel and via in the same step;

(d) depositing an electrical conductor into the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

20. The method of claim 19 wherein the insulating layer is a polymeric dielectric which is uncured prior to stamping.

21. A method for fabricating a multilayer electrical interconnect, comprising the following steps in the sequence set forth:

(a) providing an insulating layer on a base;
(b) forming a channel in the top surface and partially through the thickness of the insulating layer;
(c) forming a via in the top surface and completely through the thickness of the insulating layer adjacent the channel;

wherein forming the channel and via in steps (a), (b) and (c) comprises the following steps in the sequence set forth:

providing a first photoimagible insulating layer having a thickness that defines the distance from the bottom of the channel to the base over the base;

providing a first mask which defines the via over the first photoimagible insulating layer;

directing a light source through the first mask at the first photoimagible insulating layer to alter the solubility of the exposed regions of the first photoimagible insulating layer;

removing regions of the first photoimagible insulating layer in the via;

providing a second photoimagible insulating layer with a thickness that defines the depth of the channel over the first photoimagible insulating layer;

providing a second mask which defines the channel and the via over the second photoimagible insulating layer;

directing a light source through the second mask at the second photoimagible insulating layer to alter the solubility of the exposed regions of the second photoimagible insulating layer; and removing material from the regions of the second photoimagible insulating layer in the channel and the via, thereby forming the channel and via;

(d) depositing an electrical conductor into the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

22. The method of claim 21 wherein the first and second photoimagible insulating layers are a photoimagible polymeric.

23. The method of claim 22, wherein the first photoimagible insulating layer is uncured photoimagible polyimide;

the first mask covers the via;

the second photoimagible insulating layer is uncured photoimagible polyimide;

the second mask covers the channel and via; and further comprising the step of curing the first and second photoimagible polyimide layers after the channel and via are formed.

24. A method for fabricating a multilayer electrical interconnect, comprising the following steps in the sequence set forth:

(a) providing an insulating layer on a base;

(b) forming a channel in the top surface and partially through the thickness of the insulating layer;

(c) forming a via in the top surface and completely through the thickness of the insulating layer adjacent the channel;

wherein forming the channel and via in steps (b) and (c) comprises:

covering the insulating layer with a mask having an opening to expose the channel and via;

applying an etch to remove material from the insulating layer where the channel and via are exposed until the channel is etched and the via is partially etched through the thickness of the insulating layer; and applying a laser beam to the partially etched via to remove material from the insulating layer remaining in the via, thereby forming the channel and via;

(d) depositing an electrical conductor into the channel and via; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

25. The method of claim 24 further comprising the step of applying a second etch to remove material from the insulating layer remaining where the via is exposed after applying the laser beam.

26. The method of claim 25 wherein the mask is a metal mask and further comprising the step of removing the metal mask after the etch is applied.

27. The method of claims 1, 7, 11, 19, 21 or 24 wherein the deposited conductor in step (d) substantially fills the channel and via.

28. The method of claim 27, wherein
after forming the channel and via in steps (b) and (c) but before depositing the conductor in step (d), depositing a seed layer over the interconnect and into the channel and via; and
depositing the conductor in step (d) over the seed layer.

29. The method of claim 27 wherein depositing the electrical conductor in step (d) comprises:
depositing a first electrical conductor into the via so that the first conductor fills the via substantially to the height of the bottom of the channel; and
depositing a second electrical conductor over the first conductor in the via and the channel so that the channel and via are substantially filled with the first and second conductors.

30. The method of claim 29, further comprising:
depositing a seed layer over the interconnect and onto the first conductor and the channel; and depositing the second conductor over the seed layer.

31. The method of claim 27 wherein the electrical conductor is copper.

32. The method of claim 27 wherein the planarization in step (e) is performed by polishing comprising a rotating pad.

33. The method of claim 27 wherein the multilevel electrical interconnect is an integrated circuit.

34. The method of claim 27 wherein the multilevel electrical interconnect is a substrate.

35. The method of claim 34 wherein the substrate is a copper/polyimide substrate.

36. The method of claim 15 wherein the electrical conductor is copper.

37. The method of claim 15 wherein the planarization in step (e) is performed by polishing comprising a rotating pad.

38. The method of claim 15 wherein the multilevel electrical interconnect is an integrated circuit.

39. The method of claim 15 wherein the multilevel electrical interconnect is a substrate.

40. The method of claim 39 wherein the substrate is a copper/polyimide substrate.

41. A method for fabricating a multilayer electrical interconnect, comprising the following steps in the sequence set forth:

(a) providing an insulating layer on a base;

(b) forming a channel in the top surface and partially through the thickness of the insulating layer;

(c) forming a via in the top surface and completely through the thickness of the insulating layer adjacent the channel;

wherein forming the channel and via in steps (b) and (c) comprises:

covering the insulating layer with a first soft mask having an opening to expose the via and channel, wherein the first soft mask is erodible by a first etch;

applying a first etch to remove material from the insulating layer where the channel and via are exposed and to either partially or completely erode the first soft mask;

covering the insulating layer with a second soft mask having an opening to expose the via but covering the channel, wherein the second soft mask is erodible by a second etch; and applying a second etch to remove material from the insulating layer remaining where the via is exposed until the second soft mask is either partially or completely eroded and the channel and via are etched, thereby forming the channel and via;

(d) depositing an electrical conductor into the channel and via by depositing a first electrical conductor into the via so that the first conductor fills the via substantially to the height of the bottom of the channel, depositing a seed layer over the interconnect and onto the first conductor and channel, and depositing a second electrical conductor over the seed layer so that the channel and via are substantially filled with the first and second conductors; and (e) planarizing the interconnect top surface so that the electrically conductive layer remains only in the channel and via and is otherwise removed from the top surface of the insulating layer, and the interconnect top surface is substantially smooth, thereby forming an electrically conducting channel interconnected to an electrically conducting via.

42. The method of claim 41 wherein the first and second etches are performed by photoablation.

43. The method of claim 41 wherein the first and second etches are performed by plasma etching.

44. The method of claim 41 wherein the insulating layer is polyimide and the first and second soft masks are a material selected from the group consisting of photoresist, silicon-dioxide, and silicon-nitride, and further comprising the step of:

removing any portions of the first or second soft masks that remain on the substrate top surface after the second etch.

45. The method of claim 41 wherein the electrical conductors are copper.

46. The method of claim 41 wherein the planarization in step (e) is performed by polishing comprising a rotating pad.

47. The method of claim 41 wherein the multilevel electrical interconnect is an integrated circuit.

48. The method of claim 41 wherein the multilevel electrical interconnect is a substrate.

49. The method of claim 48 wherein the substrate is a copper/polyimide substrate.

* * * * *

UNITED STATES PATENT AND TRADEMARK OFFICE
CERTIFICATE OF CORRECTION

PATENT NO. : 5,091,339

DATED : 02/25/92

INVENTOR(S) : CAREY

It is certified that error appears in the above—identified patent and that said Letter Patent is hereby corrected as shown below:

Column 4, line 47, change "Order" to -- order --.

Column 10, line 46, change "113" to --112--.

Column 12, line 20, change "interconnect" to -- interconnected --.

Column 13, line 3, change "interconnect" to -- interconnected --.

Signed and Sealed this

Fifteenth Day of February, 1994

Attest:

BRUCE LEHMAN

Attesting Officer   Commissioner of Patents and Trademarks